US012782861B2

(12) United States Patent
Muraki

(10) Patent No.: US 12,782,861 B2
(45) Date of Patent: Nov. 3, 2026

(54) CIRCUIT, LIGHT-EMITTING DEVICE, AND IMAGE FORMING APPARATUS

(71) Applicant: CANON KABUSHIKI KAISHA, Tokyo (JP)

(72) Inventor: Taro Muraki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 23 days.

(21) Appl. No.: 18/975,930

(22) Filed: Dec. 10, 2024

(65) Prior Publication Data

US 2025/0199455 A1 Jun. 19, 2025

(30) Foreign Application Priority Data

Dec. 14, 2023 (JP) ................................ 2023-211543

(51) Int. Cl.

| | |
|---|---|
| ***G03G 15/00*** | (2006.01) |
| ***G03G 15/04*** | (2006.01) |
| ***H10D 86/40*** | (2025.01) |
| *H10H 29/24* | (2025.01) |

(52) U.S. Cl.

CPC ....... *G03G 15/80* (2013.01); *G03G 15/04036* (2013.01); *G03G 15/04054* (2013.01); *H10D 86/441* (2025.01); *H10H 29/24* (2025.01)

(58) Field of Classification Search

CPC ....... G03G 15/04036; G03G 15/04054; G03G 15/043; G03G 15/80; H04N 1/295; H03F 3/343; H03F 3/347; H10D 86/441; H10H 29/24

See application file for complete search history.

(56) References Cited

U.S. PATENT DOCUMENTS

2002/0196212 A1* 12/2002 Nishitoba ............ G09G 3/3241 345/76
2004/0189275 A1 9/2004 Yoneyama
2011/0227653 A1* 9/2011 Degoirat .............. H03H 11/245 330/288

(Continued)

FOREIGN PATENT DOCUMENTS

JP H05102748 A 4/1993
JP 2000236226 A 8/2000

(Continued)

*Primary Examiner* — Sophia S Chen

(74) *Attorney, Agent, or Firm* — Canon U.S.A., Inc. IP Division

(57) ABSTRACT

A circuit includes a current source electrically connected to a first voltage node, a first metal-oxide semiconductor (MOS) transistor of a first type, a second MOS transistor of a second type electrically connected to a second voltage node, a third MOS transistor of the first type, a first wiring connected to a gate of the first MOS transistor and a gate of the third MOS transistor, and a wiring connected to a node between the gate of the first MOS transistor and the gate of the third MOS transistor and a node between the first MOS transistor and the current source. The current source, the first MOS transistor, and the second MOS transistor are arranged in sequence in an electrical path between the first voltage node and the second voltage node. A current corresponding to a current which flows through the electrical path flows to the third MOS transistor.

16 Claims, 16 Drawing Sheets

(56) References Cited

U.S. PATENT DOCUMENTS

| | | | | |
|---|---|---|---|---|
| 2018/0074430 | A1* | 3/2018 | Odagiri .................. | H04N 1/295 |
| 2022/0329707 | A1* | 10/2022 | Suzuki ............. | G03G 15/04054 |
| 2023/0155498 | A1* | 5/2023 | Saito ....................... | G05F 3/262 |
| | | | | 323/282 |

FOREIGN PATENT DOCUMENTS

| | | | |
|---|---|---|---|
| JP | 2004287162 | A | 10/2004 |
| JP | 2016170501 | A | 9/2016 |

* cited by examiner

CIRCUIT, LIGHT-EMITTING DEVICE, AND IMAGE FORMING APPARATUS

BACKGROUND

Field of the Disclosure

Aspects of the present disclosure generally relate to a circuit, a light-emitting device, and an image forming apparatus.

Description of the Related Art

Japanese Patent Application Laid-Open No. H05-102748 discusses a current mirror circuit which has the function of duplicating a current which flows to one circuit to another circuit.

However, in the discussed current mirror circuit, a voltage may drop due to the unevenness of wiring resistances included in the current mirror circuit, so that the accuracy of duplicating a current may decrease.

SUMMARY

Aspects of the present disclosure are generally directed to providing a circuit capable of preventing or reducing a decrease in the accuracy of duplicating a current.

According to an aspect of the present disclosure, a circuit includes a current source electrically connected to a first voltage node, a first metal-oxide semiconductor (MOS) transistor of a first type, a second MOS transistor of a second type electrically connected to a second voltage node, a third MOS transistor of the first type, a first wiring connected to a gate of the first MOS transistor and a gate of the third MOS transistor, and a wiring connected to a node between the gate of the first MOS transistor and the gate of the third MOS transistor and a node between the first MOS transistor and the current source, wherein the current source, the first MOS transistor, and the second MOS transistor are arranged in sequence in an electrical path between the first voltage node and the second voltage node, and wherein a current corresponding to a current which flows through the electrical path flows to the third MOS transistor.

Further features of the present disclosure will become apparent from the following description of exemplary embodiments with reference to the attached drawings.

DESCRIPTION OF THE EMBODIMENTS

Figure 1:
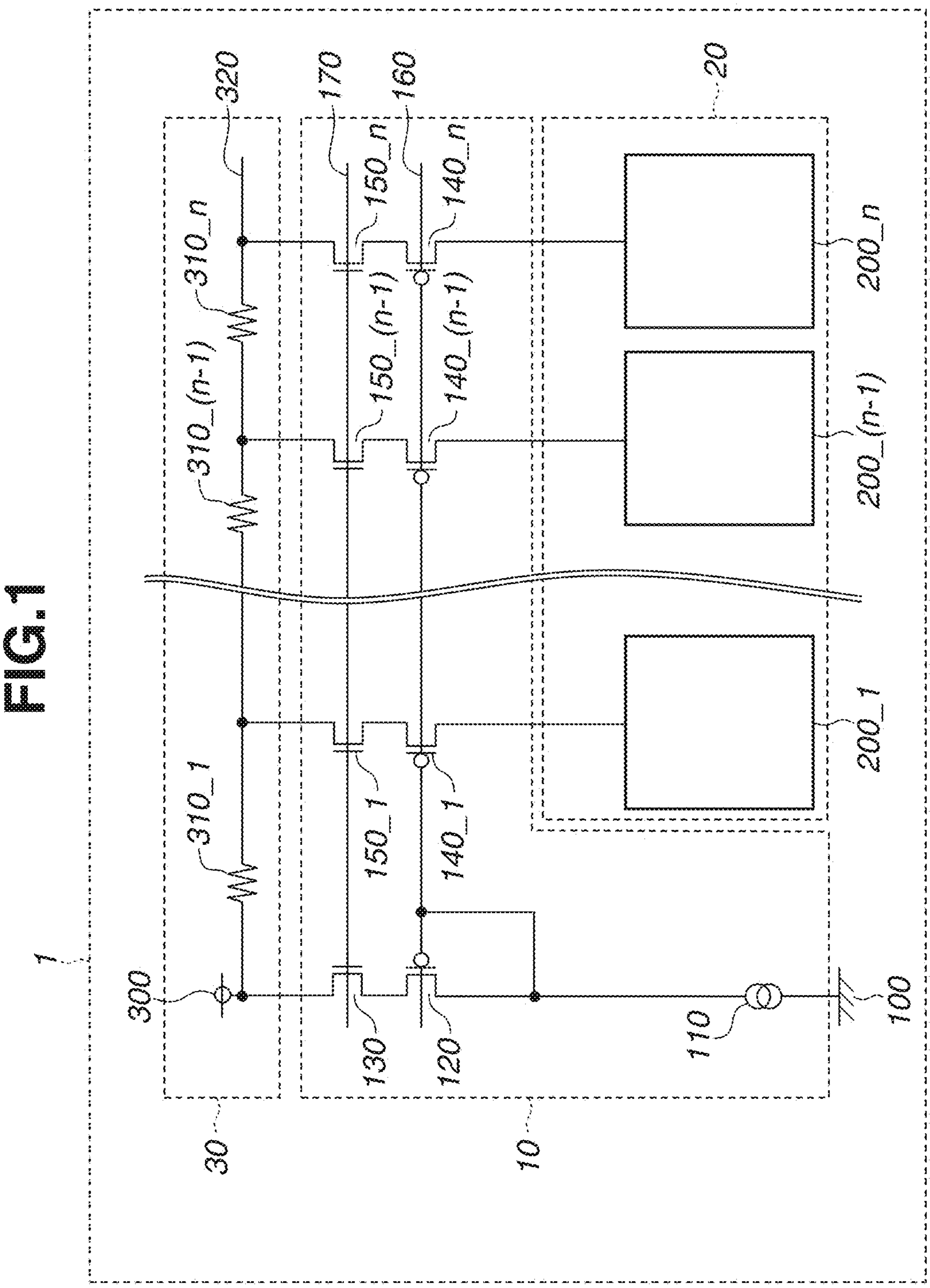
FIG. 1 is a circuit diagram used to explain a circuit according to one or more aspects of the present disclosure.

Various exemplary embodiments, features, and aspects of the disclosure will be described in detail below with reference to the drawings. Furthermore, the following exemplary embodiments should not be construed to limit the disclosure set forth in claims. While a plurality of features and aspects are described in the exemplary embodiments, not all of the plurality of features and aspects are necessarily essential for the disclosure, and, moreover, the plurality of features and aspects can be optionally combined. Additionally, in the accompanying drawings, the same or similar constituent elements are assigned the respective same reference numerals and any repetitive description thereof may be omitted as appropriate.

In the present specification, terms representing specific directions or positions (for example, “up”, “upward”, “above”, “over”, “down”, “downward”, “below”, “under”, “right”, “rightward”, “left”, and “leftward”) are used as needed. Using such terms are intended to facilitate understanding of each exemplary embodiment by referring to the drawings, and the technical scope of the disclosure should not be construed to be limited by the meanings of such terms.

In the present specification, the case of describing “electrically connecting a member A and a member B” is not limited to a case where the member A and the member B are directly connected to each other. For example, as long as the member A and the member B are electrically connected to each other, another member C can be connected to between the member A and the member B.

The relationship of “approximately equal” stated in the present specification is as follows. While the relationship of “equal” is mentioned in terms of design, a slight difference may occur due to manufacturing errors. Such a slight difference occurring due to o manufacturing errors is included in the term “approximately equal”.

A circuit according to a first exemplary embodiment of the present disclosure is described with reference to FIG. 1.

FIG. 1 is an example of a circuit diagram of a circuit according to the first exemplary embodiment.

As illustrated in FIG. 1, a circuit 1 includes a current mirror circuit 10, a load circuit 20, a power source circuit 30, and a first voltage node 100. Furthermore, the first voltage node 100 can be, for example, a node which supplies a reference voltage.

The current mirror circuit 10 includes a current source 110, a first metal-oxide semiconductor (MOS) transistor 120, a second MOS transistor 130, a plurality of third MOS transistors 140, and a plurality of fourth MOS transistors 150. Additionally, the current mirror circuit 10 further includes a first wiring 160 and a second wiring 170. Furthermore, the first MOS transistor 120 and each of the plurality of third MOS transistors 140 have a configuration approximately equal in the ratio between the gate width and the gate length.

The first wiring 160 is electrically connected to the gate of the first MOS transistor 120, and supplies a control signal to the gate thereof. Additionally, the first wiring 160 is electrically connected to each of the gates of the plurality of third MOS transistors 140, and supplies a control signal to each of the gates thereof.

Thus, the gate of the first MOS transistor 120 and each of the gates of the plurality of third MOS transistors 140 are electrically connected to each other via the first wiring 160.

The second wiring 170 is electrically connected to the gate of the second MOS transistor 130, and supplies a control signal to the gate thereof. Additionally, the second wiring 170 is electrically connected to each of the gates of the plurality of fourth MOS transistors 150, and supplies a control signal to each of the gates thereof.

Thus, the gate of the second MOS transistor 130 and each of the gates of the plurality of fourth MOS transistors 150 are electrically connected to each other via the second wiring 170. The voltage value which is applied via the second wiring 170 is set to, for example, a voltage value at which the second MOS transistor 130 and the fourth MOS transistor 150 operate in a saturation region.

The current source 110, the first MOS transistor 120, and the plurality of third MOS transistors 140 function in combination as a current mirror circuit. In response to a current being supplied from the current source 110 to the first MOS transistor 120, the gate voltage of the first MOS transistor 120 is determined. The determined gate voltage is applied as a control signal to each of the gates of the plurality of third MOS transistors 140 arranged in the corresponding columns. As a result, a current corresponding to a current which flows to the first MOS transistor 120 is supplied to the load circuit 20 via the plurality of third MOS transistors 140 arranged in the corresponding columns. Thus, the current value of a current which flows through the electrical path between the first voltage node 100 and a second voltage node 300 described below and the current value of a current which flows to the third MOS transistor 140 are approximately equal to each other.

Furthermore, in the following description, in a case where it is necessary to distinguish between the respective third MOS transistors 140, the respective tail ends of reference numerals of the third MOS transistors 140 are assigned identification numbers (1, 2, . . . , n). However, in a case where it is not necessary to distinguish between the respective third MOS transistors 140, the identification numbers at the respective tail ends of reference numerals of the third MOS transistors 140 are omitted. Furthermore, in the following description, in a case where it is necessary to distinguish between the respective fourth MOS transistors 150, the respective tail ends of reference numerals of the fourth MOS transistors 150 are assigned identification numbers (1, 2, . . . , n). However, in a case where it is not necessary to distinguish between the respective fourth MOS transistors 150, the identification numbers at the respective tail ends of reference numerals of the fourth MOS transistors 150 are omitted.

The load circuit 20 includes a plurality of load elements 200. Furthermore, in the following description, in a case where it is necessary to distinguish between the respective load elements 200, the respective tail ends of reference numerals of the load elements 200 are assigned identification numbers (1, 2, . . . , n). However, in a case where it is not necessary to distinguish between the respective load elements 200, the identification numbers at the respective tail ends of reference numerals of the load elements 200 are omitted.

The power source circuit 30 includes a second voltage node 300, a plurality of resistance elements 310, and a third wiring 320. The plurality of resistance elements 310 is arranged in the third wiring 320, and the respective ones of the plurality of resistance elements 310 are electrically connected to each other. Furthermore, the second voltage node 300 can be, for example, a node which supplies a power source voltage. Furthermore, in the following description, in a case where it is necessary to distinguish between the respective resistance elements 310, the respective tail ends of reference numerals of the resistance elements 310 are assigned identification numbers (1, 2, . . . , n). However, in a case where it is not necessary to distinguish between the respective resistance elements 310, the identification numbers at the respective tail ends of reference numerals of the resistance elements 310 are omitted. Furthermore, the resistance element 310 is formed from, for example, a MOS transistor provided as an element or a sheet resistance element. However, without the resistance element 310 being provided, a parasitic resistance included in the third wiring 320 can be used instead of the resistance element 310 in the first exemplary embodiment.

In the configuration illustrated in FIG. 1, the first MOS transistor 120 is of the P-type, the second MOS transistor 130 is of the N-type, the third MOS transistor 140 is of the P-type, and the fourth MOS transistor 150 is of the N-type. However, a configuration in which the first MOS transistor 120 is of the N-type, the second MOS transistor 130 is of the P-type, the third MOS transistor 140 is of the N-type, and the fourth MOS transistor 150 is of the P-type can be employed. Moreover, in that case, the first voltage node 100 can be, for example, a node which supplies a power source voltage, and the second voltage node 300 can be, for example, a node which supplies a reference voltage. Furthermore, in the following description, the P-type may be reworded as a first type, and the N-type may be reworded as a second type.

Furthermore, in the following description, sources and drains are defined on the presumption that the first MOS transistor 120 and the third MOS transistor 140 are of the P-type and the second MOS transistor 130 and the fourth MOS transistor 150 are of the N-type. However, in a case where the first MOS transistor 120 and the third MOS transistor 140 are of the N-type and the second MOS transistor 130 and the fourth MOS transistor 150 are of the P-type, the source in the following description signifies a drain, and the drain in the following description signifies a source.

The current source 110 is electrically connected to the first voltage node 100, and the first voltage node 100 supplies a reference voltage to the current source 110. The drain of the first MOS transistor 120 is electrically connected to the current source 110. The source of the second MOS transistor

130 is electrically connected to the source of the first MOS transistor 120. The second voltage node 300 is electrically connected to the drain of the second MOS transistor 130, and the second voltage node 300 supplies a power source voltage to the second MOS transistor 130. Thus, the first voltage node 100, the current source 110, the first MOS transistor 120, the second MOS transistor 130, and the second voltage node 300 are electrically connected in sequence. Moreover, a wiring which electrically interconnects a node between the current source 110 and the drain of the first MOS transistor 120 and a node between the gate of the first MOS transistor 120 and the gate of the third MOS transistor 140_1 is arranged.

The respective drains of the plurality of third MOS transistors 140 are electrically connected to the respective ones of the plurality of load elements 200. For example, the drain of the third MOS transistor 140_1 is electrically connected to the load element 200_1.

The respective sources of the plurality of fourth MOS transistors 150 are electrically connected to the respective associated sources of the plurality of third MOS transistors 140. For example, the source of the fourth MOS transistor 150_1 is electrically connected to the source of the third MOS transistor 140_1.

The third wiring 320 is electrically connected to the drain of the second MOS transistor 130. Moreover, the third wiring 320 is electrically connected to the respective drains of the plurality of fourth MOS transistors 150. Thus, the drain of the second MOS transistor 130 is electrically connected to the respective drains of the plurality of fourth MOS transistors 150 via the third wiring 320.

Each of the plurality of resistance elements 310 is arranged between respective two adjacent connection nodes of a plurality of connection nodes at which the drain of the second MOS transistor 130 or the drains of the plurality of fourth MOS transistors 150 are connected to the third wiring 320. For example, the resistance element 310_1 is arranged between a connection node at which the drain of the second MOS transistor 130 is connected to the third wiring 320 and a connection node at which the drain of the fourth MOS transistor 150_1 is connected to the third wiring 320. Thus, the load element 200, the third MOS transistor 140, the fourth MOS transistor 150, the resistance element 310, and the second voltage node 300 are electrically connected in sequence.

Here, at the time of driving of the load circuit 20, when a current which flows to the first MOS transistor 120 is denoted by $I_{120}$, the following equation (1) holds under a saturation condition of MOS transistor:

$$I_{120} = \frac{1}{2}\mu C_{OX}\frac{W}{L}(V_{gs120} - V_{th})^2(1 + \lambda V_{ds120}). \tag{1}$$

Furthermore, μ denotes the electron mobility, Cox denotes the gate oxide membrane capacity per unit area, W denotes the gate width, and L denotes the gate length. Moreover, $V_{gs120}$ denotes a gate-source voltage of the first MOS transistor 120, $V_{th}$ denotes a threshold voltage, λ denotes the channel length conversion effect coefficient, and $V_{ds120}$ denotes a drain-source voltage of the first MOS transistor 120.

Moreover, a source voltage of the first MOS transistor 120 is denoted by $V_{s120}$, a gate voltage of the second MOS transistor 130 is denoted by $V_{g130}$, and a gate-source voltage of the second MOS transistor 130 is denoted by $V_{gs130}$. With the second MOS transistor 130 being focused on, the source voltage $V_{s120}$ satisfies the following equation (2):

$$V_{s120} = V_{g130} - V_{gs130}. \tag{2}$$

Moreover, a gate voltage of the first MOS transistor 120 is denoted by $V_{g120}$, and a gate-source voltage of the first MOS transistor 120 is denoted by $V_{gs120}$. With the first MOS transistor 120 being focused on, the gate voltage $V_{g120}$ satisfies the following equation (3) using the equation (2):

$$V_{g120} = V_{s120} - V_{gs120} = V_{g130} - V_{gs130} - V_{gs120}. \tag{3}$$

Moreover, at the time of driving of the load circuit 20, when a current which flows to the fourth MOS transistor 150 is denoted by $I_{150}$, a gate-source voltage of the fourth MOS transistor 150 is denoted by $V_{gs150}$, and a drain-source voltage of the second MOS transistor 130 is denoted by $V_{ds130}$. Moreover, the amount of voltage drop in the power source circuit 30 is denoted by ΔV, and the amount of change in current caused by voltage drop is denoted by $\Delta I_d$.

The following equation (4) holds under the saturation condition of MOS transistor:

$$I_{150} = I_{120} - \Delta I_d = \frac{1}{2}\mu C_{OX}\frac{W}{L}(V_{gs150} - V_{th})^2\{1 + \lambda(V_{ds130} - \Delta V)\}. \tag{4}$$

With the equation (4) being modified, the gate-source voltage $V_{gs150}$ satisfies the following equation (5):

$$V_{gs150} = \sqrt{\frac{I_{120} - \Delta I_d}{\frac{1}{2}\mu C_{OX}\frac{W}{L}\{1 + \lambda(V_{ds130} - \Delta V)\}}} + V_{th}. \tag{5}$$

Moreover, at the time of driving of the load circuit 20, a current which flows to the third MOS transistor 140 is denoted by $I_{140}$, a gate-source voltage of the third MOS transistor 140 is denoted by $V_{gs140}$, and a drain-source voltage of the third MOS transistor 140 is denoted by $V_{ds140}$. The following equation (6) holds under the saturation condition of MOS transistor:

$$I_{140} = \frac{1}{2}\mu C_{OX}\frac{W}{L}(V_{gs140} - V_{th})^2(1 + \lambda V_{ds140}). \tag{6}$$

Moreover, a source voltage of the third MOS transistor 140 is denoted by $V_{s140}$ and a gate-source voltage of the fourth MOS transistor 150 is denoted by $V_{gs150}$. With the fourth MOS transistor 150 being focused on, the source voltage $V_{s140}$ satisfies the following equation (7):

$$V_{s140} = V_{g130} - V_{gs150}. \tag{7}$$

Moreover, with the third MOS transistor 140 being focused on, the gate-source voltage $V_{gs140}$ satisfies the following equation (8):

$$V_{gs140} = V_{s140} - V_{g120}. \tag{8}$$

Here, with the equation (8) being modified using the equation (3) and the equation (7), the following equation (9) holds:

$$V_{gs140} = V_{g130} - V_{gs150} - (V_{g130} - V_{gs130} - V_{gs120}) = V_{gs130} + V_{gs120} - V_{gs150}. \tag{9}$$

Here, with the equation (6) being modified using the equation (9), the following equation (10) holds:

$$I_{140} = \frac{1}{2}\mu C_{OX}\frac{W}{L}(V_{gs130} + V_{gs120} - V_{gs150} - V_{th})^2(1 + \lambda V_{ds140}). \tag{10}$$

By assigning the equation (5) to the equation (10), the current $I_{140}$ is derived with use of the amount of voltage drop ΔV. Furthermore, the variation in current caused by the amount of voltage drop ΔV has an influence as a change amount of short channel length effect of the fourth MOS transistor 150, which occurs due to the variation in the amount of voltage drop ΔV. Therefore, "$\lambda$ ($V_{ds}$–ΔV)", in which the amount of voltage drop ΔV is included, commonly satisfies a relationship of "$\lambda$ ($V_{ds}$–ΔV)<<1". Therefore, the current $I_{140}$ is not much affected by the amount of voltage drop ΔV.

Here, to explain an advantageous effect of the first exemplary embodiment, a circuit according to a reference example serving as a target for comparison is described. The circuit according to the reference example is described with reference to FIG. 2.

Figure 2:
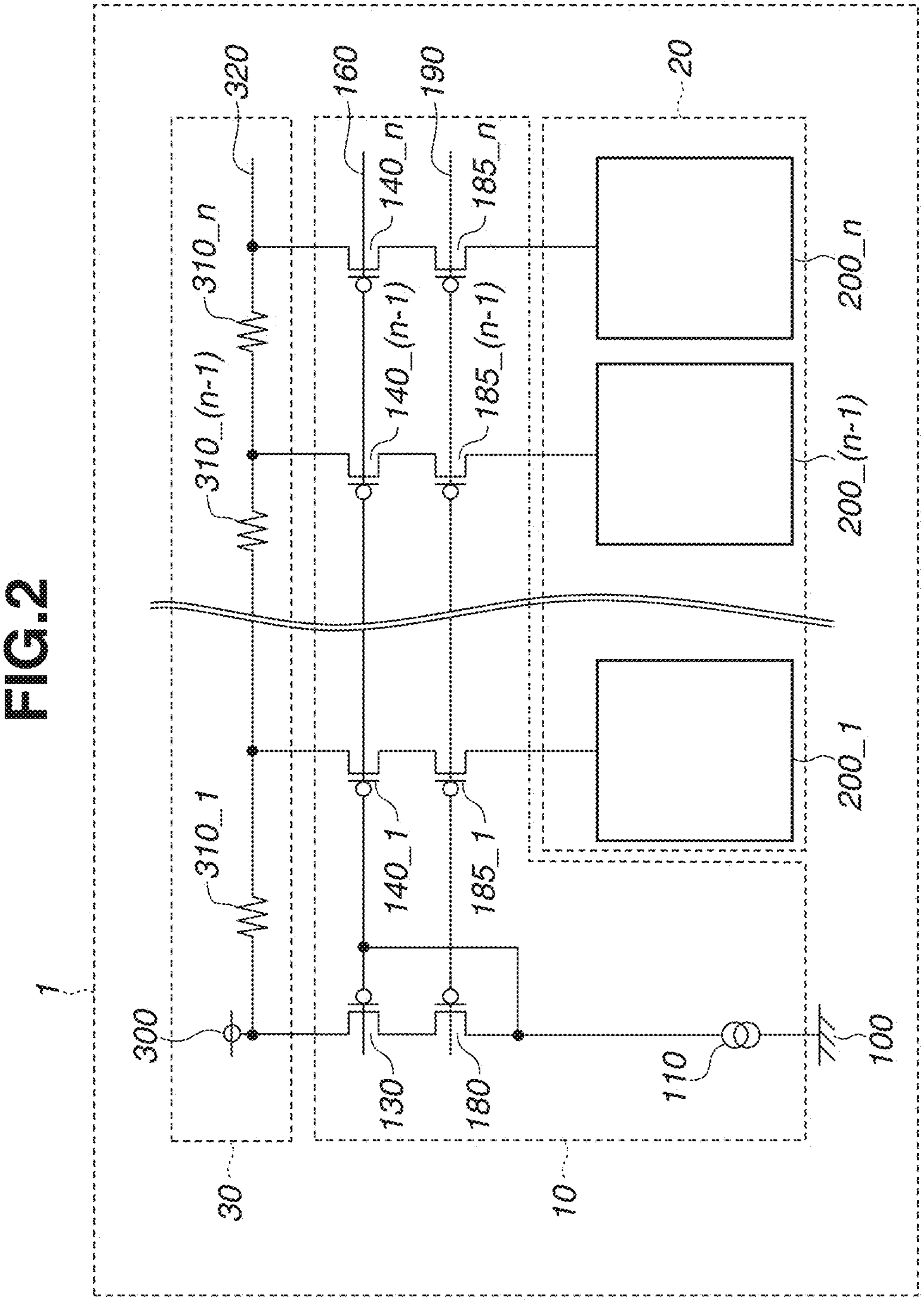
FIG. 2 is a circuit diagram used to explain a circuit according to one or more aspects of the present disclosure in a reference example.

FIG. 2 is an example of a circuit diagram of the circuit according to the reference example. Furthermore, constituent elements similar to those in the first exemplary embodiment are assigned the respective same reference characters as those in the first exemplary embodiment, and the description about these constituent elements may be omitted or simplified.

As illustrated in FIG. 2, a circuit 1 includes a current mirror circuit 10, a load circuit 20, a power source circuit 30, and a first voltage node 100. Furthermore, the first voltage node 100 can be, for example, a node which supplies a reference voltage.

The current mirror circuit 10 includes a current source 110, a first MOS transistor 120, a fifth MOS transistor 180, a plurality of third MOS transistors 140, and a plurality of sixth MOS transistors 185. Additionally, the current mirror circuit 10 further includes a first wiring 160 and a fourth wiring 190. Furthermore, the first MOS transistor 120 and each of the plurality of third MOS transistors 140 have a configuration approximately equal in the ratio between the gate width and the gate length.

The first wiring 160 is electrically connected to the gate of the first MOS transistor 120, and supplies a control signal to the gate thereof. Additionally, the first wiring 160 is electrically connected to each of the gates of the plurality of third MOS transistors 140, and supplies a control signal to each of the gates thereof.

Thus, the gate of the first MOS transistor 120 and each of the gates of the plurality of third MOS transistors 140 are electrically connected to each other via the first wiring 160.

The fourth wiring 190 is electrically connected to the gate of the fifth MOS transistor 180, and supplies a control signal to the gate thereof. Additionally, the fourth wiring 190 is electrically connected to each of the gates of the plurality of sixth MOS transistors 185, and supplies a control signal to each of the gates thereof.

Thus, the gate of the fifth MOS transistor 180 and each of the gates of the plurality of sixth MOS transistors 185 are electrically connected to each other via the fourth wiring 190. The voltage value which is applied via the fourth wiring 190 and the voltage value which is applied via the first wiring 160 are different from each other.

The current source 110, the first MOS transistor 120, and the plurality of third MOS transistors 140 function in combination as a current mirror circuit. In response to a current being supplied from the current source 110 to the first MOS transistor 120, the gate voltage of the first MOS transistor 120 is determined. The determined gate voltage is applied as a control signal to each of the gates of the plurality of third MOS transistors 140 arranged in the corresponding columns. As a result, a current corresponding to a current which flows to the first MOS transistor 120 is supplied to the load circuit 20 via the plurality of third MOS transistors 140 arranged in the corresponding columns. Thus, the current value of a current which flows through the electrical path between the first voltage node 100 and a second voltage node 300 described below and the current value of a current which flows to the third MOS transistor 140 are approximately equal to each other.

Furthermore, in the following description, in a case where it is necessary to distinguish between the respective third MOS transistors 140, the respective tail ends of reference numerals of the third MOS transistors 140 are assigned identification numbers (1, 2, . . . , n). However, in a case where it is not necessary to distinguish between the respective third MOS transistors 140, the identification numbers at the respective tail ends of reference numerals of the third MOS transistors 140 are omitted. Furthermore, in the following description, in a case where it is necessary to distinguish between the respective sixth MOS transistors 185, the respective tail ends of reference numerals of the sixth MOS transistors 185 are assigned identification numbers (1, 2, . . . , n). However, in a case where it is not necessary to distinguish between the respective sixth MOS transistors 185, the identification numbers at the respective tail ends of reference numerals of the sixth MOS transistors 185 are omitted.

The load circuit 20 includes a plurality of load elements 200. Furthermore, in the following description, in a case where it is necessary to distinguish between the respective load elements 200, the respective tail ends of reference numerals of the load elements 200 are assigned identification numbers (1, 2, . . . , n). However, in a case where it is not necessary to distinguish between the respective load elements 200, the identification numbers at the respective tail ends of reference numerals of the load elements 200 are omitted.

The power source circuit 30 includes a second voltage node 300, a plurality of resistance elements 310, and a third wiring 320. The plurality of resistance elements 310 is arranged in the third wiring 320, and the respective ones of the plurality of resistance elements 310 are electrically connected to each other. Furthermore, the second voltage node 300 can be, for example, a node which supplies a power source voltage. Furthermore, in the following description, in a case where it is necessary to distinguish between the respective resistance elements 310, the respective tail ends of reference numerals of the resistance elements 310 are assigned identification numbers (1, 2, . . . , n). However, in a case where it is not necessary to distinguish between the respective resistance elements 310, the identification numbers at the respective tail ends of reference numerals of the resistance elements 310 are omitted. Furthermore, the resistance element 310 is formed from, for example, a MOS transistor provided as an element or a sheet resistance element. However, without the resistance element 310 being provided, a parasitic resistance included in the third wiring 320 can be used instead of the resistance element 310 in the present reference example.

In the configuration illustrated in FIG. 2, the first MOS transistor 120, the third MOS transistor 140, the fifth MOS transistor 180, and the sixth MOS transistor 185 are of the P-type. However, the first MOS transistor 120, the third MOS transistor 140, the fifth MOS transistor 180, and the sixth MOS transistor 185 can be of the N-type. Moreover, in that case, the first voltage node 100 can be, for example, a node which supplies a power source voltage, and the second voltage node 300 can be, for example, a node which supplies a reference voltage.

Furthermore, in the following description, sources and drains are defined on the presumption that the first MOS transistor 120, the third MOS transistor 140, the fifth MOS transistor 180, and the sixth MOS transistor 185 are of the P-type. However, in a case where the first MOS transistor 120, the third MOS transistor 140, the fifth MOS transistor 180, and the sixth MOS transistor 185 are of the N-type, the source in the following description signifies a drain, and the drain in the following description signifies a source.

The current source 110 is electrically connected to the first voltage node 100. The drain of the fifth MOS transistor 180 is electrically connected to the current source 110. The drain of the first MOS transistor 120 is electrically connected to the source of the fifth MOS transistor 180. The second voltage node 300 is electrically connected to the source of the first MOS transistor 120. Thus, the first voltage node 100, the current source 110, the fifth MOS transistor 180, the first MOS transistor 120, and the second voltage node 300 are electrically connected in sequence. Moreover, a wiring which electrically interconnects a node between the current source 110 and the drain of the fifth MOS transistor 180 and a node between the gate of the first MOS transistor 120 and the gate of the third MOS transistor 140_1 is arranged.

The respective drains of the plurality of sixth MOS transistors 185 are electrically connected to the respective ones of the plurality of load elements 200. For example, the drain of the sixth MOS transistor 185_1 is electrically connected to the load element 200_1.

The respective sources of the plurality of third MOS transistors 140 are electrically connected to the respective associated sources of the plurality of sixth MOS transistors 185. For example, the drain of the third MOS transistor 140_1 is electrically connected to the source of the sixth MOS transistor 185_1.

The third wiring 320 is electrically connected to the source of the first MOS transistor 120. Moreover, the third wiring 320 is electrically connected to the respective sources of the plurality of third MOS transistors 140. Thus, the source of the first MOS transistor 120 is electrically connected to the respective sources of the plurality of third MOS transistors 140 via the third wiring 320.

Each of the plurality of resistance elements 310 is arranged between respective two adjacent connection nodes of a plurality of connection nodes at which the source of the first MOS transistor 120 or the sources of the plurality of third MOS transistors 140 are connected to the third wiring 320. For example, the resistance element 310_1 is arranged between a connection node at which the source of the first MOS transistor 120 is connected to the third wiring 320 and a connection node at which the source of the third MOS transistor 140_1 is connected to the third wiring 320. Thus, the load element 200, the sixth MOS transistor 185, the third MOS transistor 140, the resistance element 310, and the second voltage node 300 are electrically connected in sequence.

Furthermore, the current mirror circuit 10 does not need to include the fifth MOS transistor 180, the plurality of sixth MOS transistors 185, and the fourth wiring 190. In that case, the drain of the first MOS transistor 120 is electrically connected to the current source 110. Thus, the first voltage node 100, the current source 110, the first MOS transistor 120, and the second voltage node 300 are electrically connected in sequence. Moreover, the respective drains of the plurality of third MOS transistors 140 are electrically connected to the respective associated elements of the plurality of load elements 200. For example, the drain of the third MOS transistor 140_1 is electrically connected to the load element 200_1.

Here, at the time of driving of the load circuit 20, a current which flows to the third MOS transistor 140 is denoted by $I_{140}$, a gate-source voltage of the first MOS transistor 120 is denoted by $V_{gs120}$, and the drain-source voltage of the third MOS transistor 140 is denoted by $V_{ds140}$. Moreover, the amount of voltage drop in the power source circuit 30 is denoted by $\Delta V$, and the amount of change in current caused by voltage drop is denoted by $\Delta I_d$. The following equation (11) holds under a saturation condition of MOS transistor:

$$I_{140} = I_{120} - \Delta I_d = \frac{1}{2}\mu C_{OX}\frac{W}{L}(V_{gs120} - \Delta V - V_{th})^2(1 + \lambda V_{ds140}). \quad (11)$$

In the equation (11), the gate-source voltage $V_{gs120}$ decreases by the amount of voltage drop $\Delta V$. Here, an electrical path extending between the source of the first MOS transistor 120 and the source of the third MOS transistor 140_1 via the third wiring 320 is referred to as a "first electrical path". Moreover, an electrical path extending between the source of the first MOS transistor 120 and the source of the third MOS transistor **140_*n* via the third wiring 320 is referred to as an "n-th electrical path". The length of the n-th electrical path becomes larger as the value "n" becomes larger. Thus, the length of the third wiring 320 included in the n-th electrical path is larger than the length of the third wiring 320 included in the first electrical path. Therefore, the number of resistance elements 310 included in the n-th electrical path becomes larger than the number of resistance elements 310 included in the first electrical path. Thus, the amount of voltage drop $\Delta V$ in the third wiring 320 included in the n-th electrical path becomes larger than the amount of voltage drop $\Delta V$ in the third wiring 320** included in the first electrical path.

Therefore, since the amount of voltage drop $\Delta V$ varies according to electrical paths, a difference occurs between currents which flow to the respective ones of the plurality of third MOS transistors 140, so that the accuracy of the current mirror circuit 10 duplicating a current decreases. Furthermore, the amount of voltage drop $\Delta V$ varies even depending on the distribution of arrangement of the plurality of load elements 200 being in a driving state, the number of plurality of load elements 200 being in a driving state, or a current which flows to the first MOS transistor 120, so that the accuracy of duplicating a current may also decrease.

In the reference example, the amount of voltage drop ΔV directly exerts an influence on the current $I_{140}$. On the other hand, in the first exemplary embodiment, the amount of voltage drop ΔV indirectly exerts an influence on the current $I_{140}$ via the fourth MOS transistor 150, so that the current $I_{140}$ is not much affected by the amount of voltage drop ΔV. Therefore, a difference is unlikely to occur between currents which flow to the respective ones of the plurality of third MOS transistors 140, so that it is possible to prevent or reduce the accuracy of the current mirror circuit 10 duplicating a current from decreasing.

Furthermore, the MOS transistor described in the above description can be a bipolar transistor.

A PNP bipolar transistor can be used instead of a P-type MOS transistor, and an NPN bipolar transistor can be used instead of an N-type MOS transistor. The gate, source, and drain of the MOS transistor described in the first exemplary embodiment can be changed to the base, emitter, and collector of the bipolar transistor, respectively.

A photoelectric conversion device according to a modification example of the first exemplary embodiment in the present disclosure is described with reference to FIGS. 3A and 3B. Furthermore, constituent elements similar to those in the first exemplary embodiment are assigned the respective same reference characters as those in the first exemplary embodiment, and the description about these constituent elements may be omitted or simplified.

The modification example of the first exemplary embodiment differs from the first exemplary embodiment in the number of circuit blocks included in the circuit 1. FIGS. 3A and 3B illustrate an example of a circuit diagram of the circuit according to the present modification example.

Figure 3A:
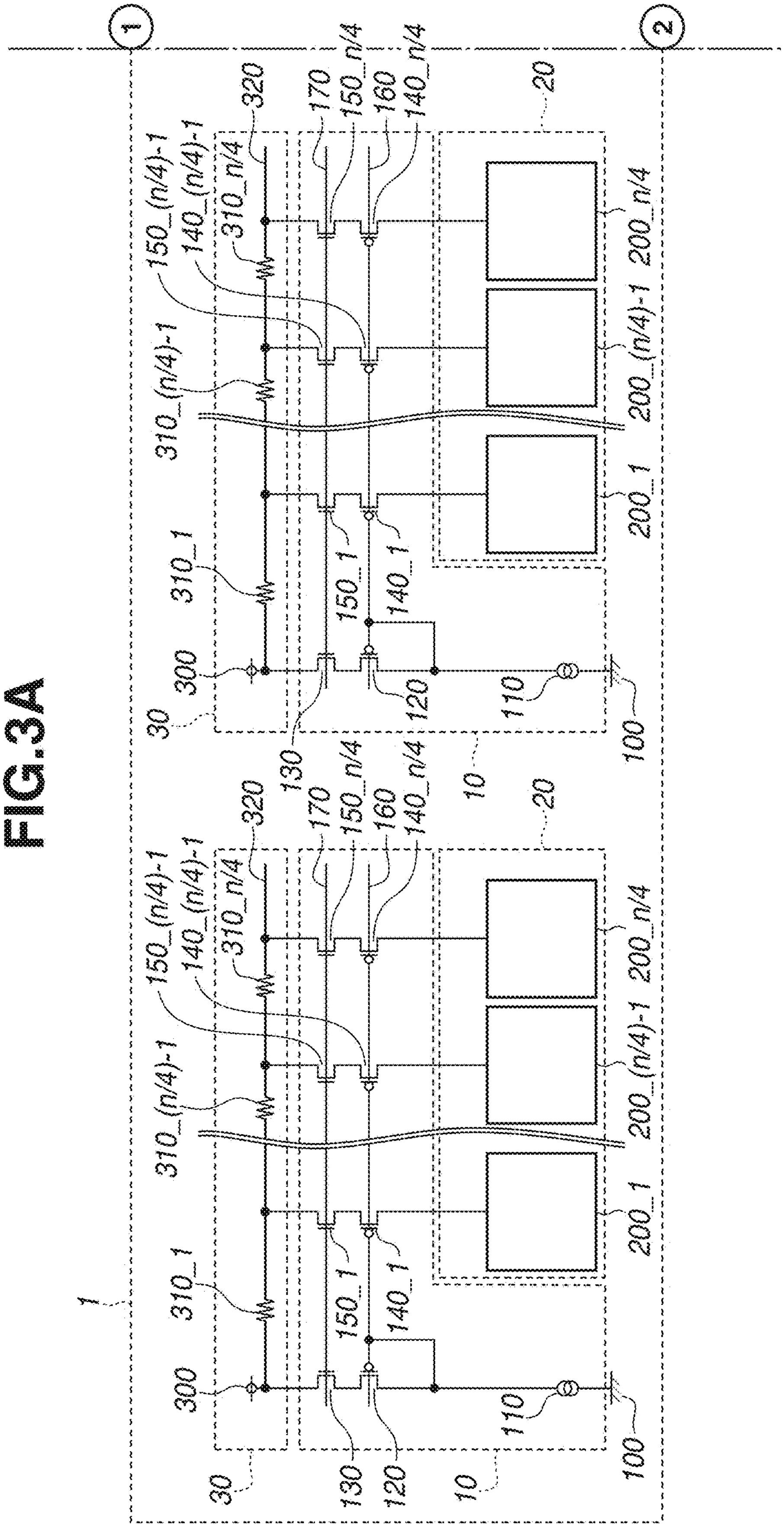
FIGS. 3A and 3B are circuit diagrams used to explain a circuit according to one or more aspects of the present disclosure in a modification example.
Figure 3B:
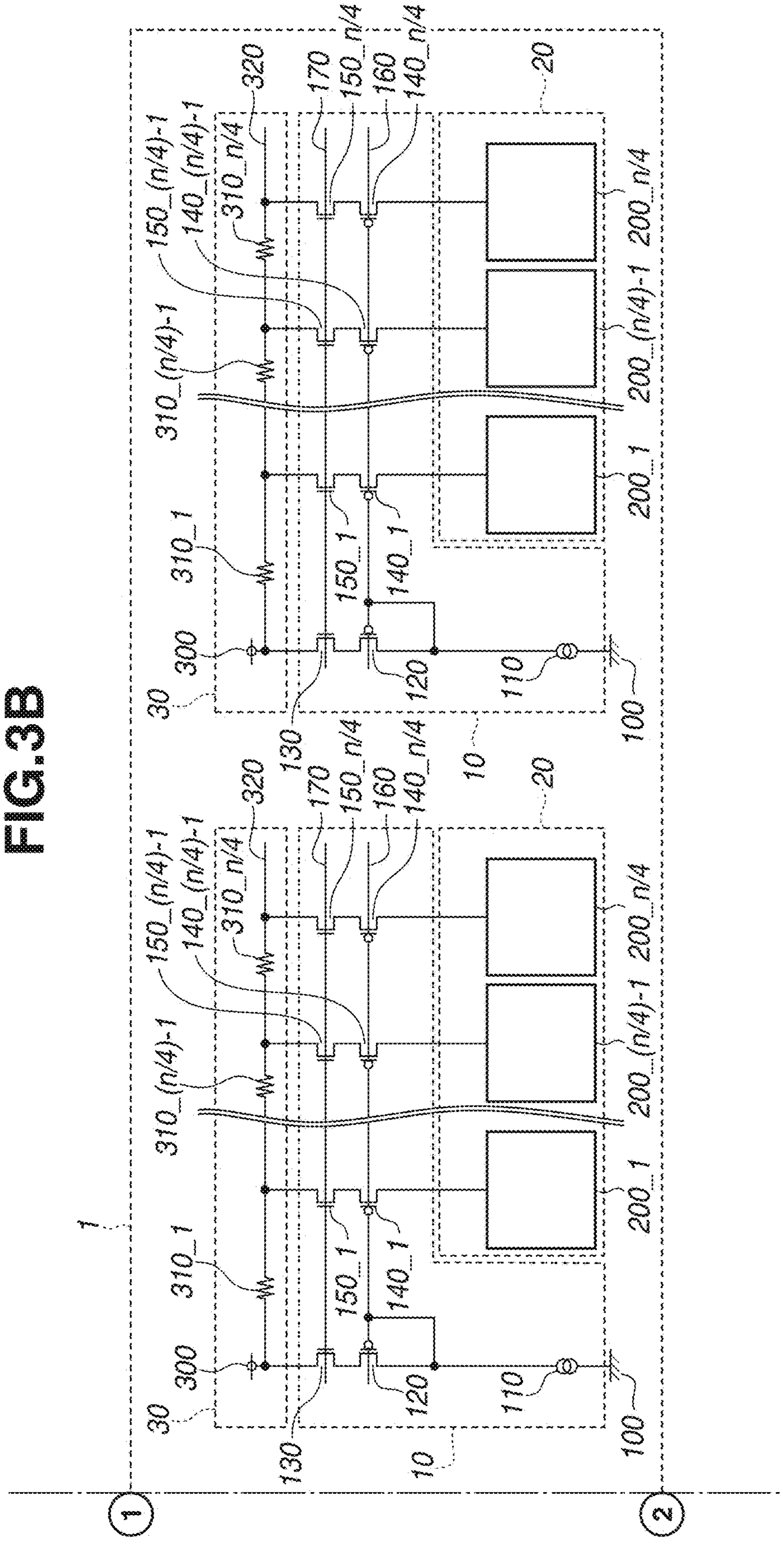

As illustrated in FIGS. 3A and 3B, the circuit 1 includes current mirror circuits 10 divided into a plurality of blocks, load circuits 20 divided into a plurality of blocks, and power source circuits 30 divided into a plurality of blocks. Here, a configuration in which a plurality of third MOS transistors 140, a plurality of fourth MOS transistors 150, a plurality of load elements 200, and a plurality of resistance elements 310 are arranged each for n columns as illustrated in FIG. 1 is referred to as a "first circuit block". On the other hand, a configuration in which a plurality of third MOS transistors 140, a plurality of fourth MOS transistors 150, a plurality of load elements 200, and a plurality of resistance elements 310 are arranged each for, for example, n/4 columns as illustrated in FIGS. 3A and 3B is referred to as a "second circuit block". Moreover, the second circuit block includes a first voltage node 100, a current source 110, a first MOS transistor 120, a second MOS transistor 130, and a second voltage node 300. The circuit 1 illustrated in FIGS. 3A and 3B includes four independent second circuit blocks. Furthermore, the number of columns included in one second circuit block is not limited to n/4, but can be n/m (m being an optional natural number). Moreover, in that case, the circuit 1 includes m independent second circuit blocks.

Accordingly, in the present modification example, a difference is not likely to occur in currents which flow to the respective ones of the plurality of third MOS transistors 140, so that it is possible to prevent or reduce the accuracy of the current mirror circuit 10 duplicating a current from decreasing.

Additionally, in the present modification example, increasing the number of independent circuit blocks included in the circuit 1 enables reducing the influence of voltage drop in each circuit block, so that it is possible to prevent or reduce the accuracy of the current mirror circuit 10 duplicating a current from decreasing.

A circuit according to a second exemplary embodiment of the present disclosure is described with reference to FIG. 4. Furthermore, constituent elements similar to those in the first exemplary embodiment are assigned the respective same reference characters as those in the first exemplary embodiment, and the description about these constituent elements may be omitted or simplified.

The second exemplary embodiment differs from the first exemplary embodiment in the configuration of the current mirror circuit 10. FIG. 4 is an example of a circuit diagram of the circuit according to the second exemplary embodiment.

Figure 4:
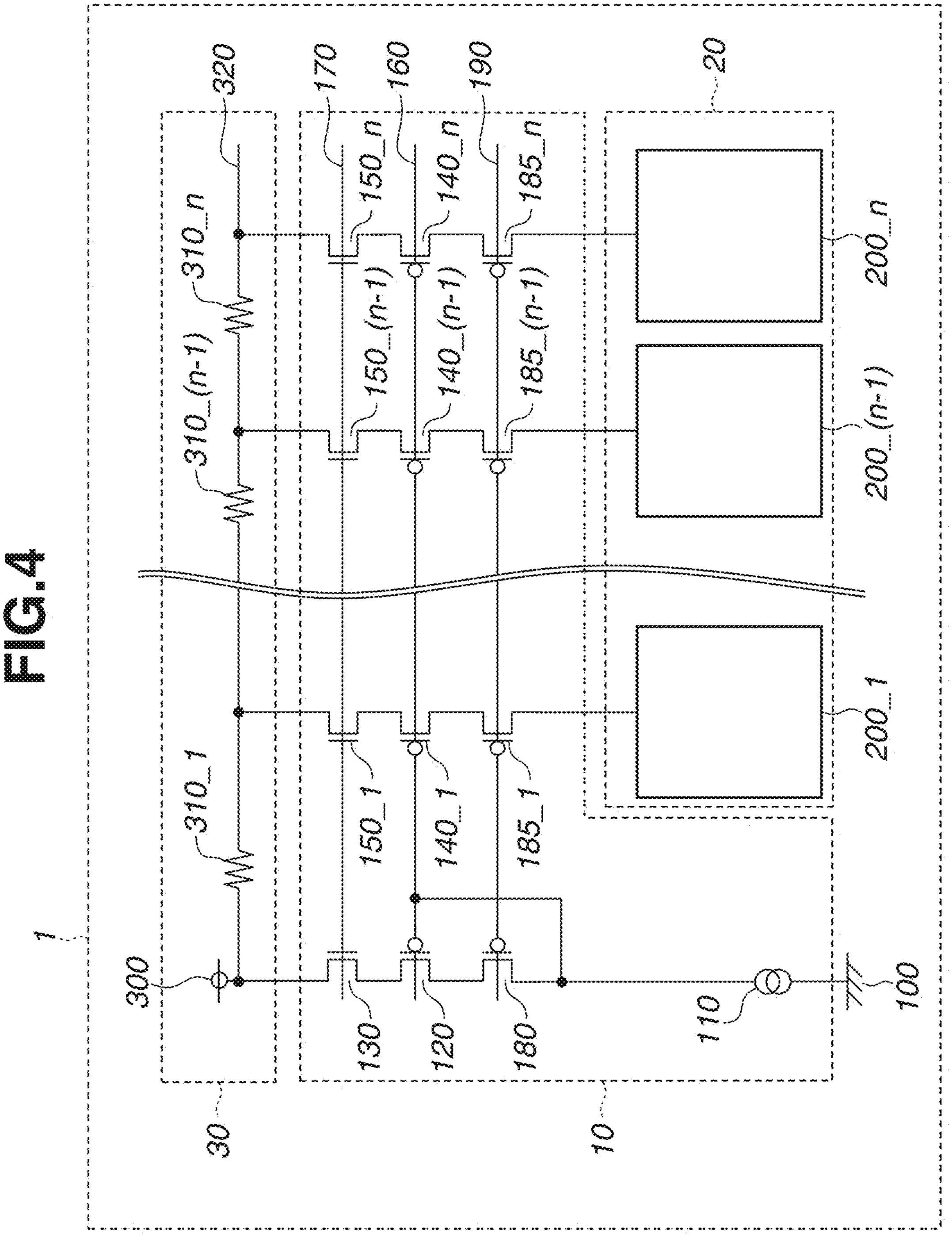
FIG. 4 is a circuit diagram used to explain a circuit according to one or more aspects of the present disclosure.

As illustrated in FIG. 4, a circuit 1 includes a current mirror circuit 10, a load circuit 20, a power source circuit 30, and a first voltage node 100. Furthermore, the first voltage node 100 can be, for example, a node which supplies a reference voltage.

The current mirror circuit 10 includes a current source 110, a first MOS transistor 120, a second MOS transistor 130, and a fifth MOS transistor 180. Additionally, the current mirror circuit 10 includes a plurality of third MOS transistors 140, a plurality of fourth MOS transistors 150, and a plurality of sixth MOS transistors 185. Additionally, the current mirror circuit 10 further includes a first wiring 160, a second wiring 170, and a fourth wiring 190. Furthermore, the first MOS transistor 120 and each of the plurality of third MOS transistors 140 have a configuration approximately equal in the ratio between the gate width and the gate length.

The fourth wiring 190 is electrically connected to the gate of the fifth MOS transistor 180, and supplies a control signal to the gate thereof. Additionally, the fourth wiring 190 is electrically connected to each of the gates of the plurality of sixth MOS transistors 185, and supplies a control signal to each of the gates thereof.

Thus, the gate of the fifth MOS transistor 180 and each of the gates of the plurality of sixth MOS transistors 185 are electrically connected to each other via the fourth wiring 190. The voltage value which is applied via the fourth wiring 190 and the voltage value which is applied via the second wiring 170 are different from each other. The load circuit 20 includes a plurality of load elements 200.

The power source circuit 30 includes a second voltage node 300, a plurality of resistance elements 310, and a third wiring 320. The plurality of resistance elements 310 is arranged in the third wiring 320, and the respective ones of the plurality of resistance elements 310 are electrically connected to each other. Furthermore, the second voltage node 300 can be, for example, a node which supplies a power source voltage.

In the configuration illustrated in FIG. 4, the first MOS transistor 120, the third MOS transistor 140, the fifth MOS transistor 180, and the sixth MOS transistor 185 are of the P-type. Moreover, the second MOS transistor 130 and the fourth MOS transistor 150 are of the N-type. However, the first MOS transistor 120, the third MOS transistor 140, the fifth MOS transistor 180, and the sixth MOS transistor 185 can be of the N-type. Moreover, in that case, the second MOS transistor 130 and the fourth MOS transistor 150 can be of the P-type. Additionally, in that case, the first voltage node 100 can be, for example, a node which supplies a power source voltage, and the second voltage node 300 can be, for example, a node which supplies a reference voltage.

The current source 110 is electrically connected to the first voltage node 100, and the first voltage node 100 supplies a reference voltage to the current source 110. The drain of the fifth MOS transistor 180 is electrically connected to the current source 110. The drain of the first MOS transistor 120 is electrically connected to the source of the fifth MOS transistor 180. The source of the second MOS transistor 130 is electrically connected to the source of the first MOS transistor 120. The second voltage node 300 is electrically connected to the drain of the second MOS transistor 130, and the second voltage node 300 supplies a power source voltage to the second MOS transistor 130. Thus, the first voltage node 100, the current source 110, the fifth MOS transistor 180, the first MOS transistor 120, the second MOS transistor 130, and the second voltage node 300 are electrically connected in sequence. Moreover, a wiring which electrically interconnects a node between the current source 110 and the drain of the fifth MOS transistor 180 and a node between the gate of the first MOS transistor 120 and the gate of the third MOS transistor 140_1 is arranged.

The respective drains of the plurality of sixth MOS transistors 185 are electrically connected to the respective ones of the plurality of load elements 200. For example, the drain of the sixth MOS transistor 185_1 is electrically connected to the load element 200_1.

The respective drains of the plurality of third MOS transistors 140 are electrically connected to the respective associated sources of the plurality of sixth MOS transistors 185. For example, the drain of the third MOS transistor 140_1 is electrically connected to the source of the sixth MOS transistor 185_1.

The respective sources of the plurality of fourth MOS transistors 150 are electrically connected to the respective associated sources of the plurality of third MOS transistors 140. For example, the source of the fourth MOS transistor 150_1 is electrically connected to the source of the third MOS transistor 140_1.

The third wiring 320 is electrically connected to the drain of the second MOS transistor 130. Moreover, the third wiring 320 is electrically connected to the respective drains of the plurality of fourth MOS transistors 150. Thus, the drain of the second MOS transistor 130 is electrically connected to the respective drains of the plurality of fourth MOS transistors 150 via the third wiring 320.

Each of the plurality of resistance elements 310 is arranged between respective two adjacent connection nodes of a plurality of connection nodes at which the drain of the second MOS transistor 130 or the drains of the plurality of fourth MOS transistors 150 are connected to the third wiring 320. For example, the resistance element 310_1 is arranged between a connection node at which the drain of the second MOS transistor 130 is connected to the third wiring 320 and a connection node at which the drain of the fourth MOS transistor 150_1 is connected to the third wiring 320. Thus, the load element 200, the sixth MOS transistor 185, the third MOS transistor 140, the fourth MOS transistor 150, the resistance element 310, and the second voltage node 300 are electrically connected in sequence.

Accordingly, in the second exemplary embodiment, a difference is not likely to occur in currents which flow to the respective ones of the plurality of third MOS transistors 140, so that it is possible to prevent or reduce the accuracy of the current mirror circuit 10 duplicating a current from decreasing.

Additionally, in the second exemplary embodiment, since circuit elements having similar configurations are electrically connected to the drain of the first MOS transistor 120 and the drain of the third MOS transistor 140, the accuracy of the current mirror circuit 10 duplicating a current is prevented or reduced from decreasing. This is because the fifth MOS transistor 180 is electrically connected to the drain of the first MOS transistor 120 and the sixth MOS transistor 185 is electrically connected to the drain of the third MOS transistor 140. Thus, since a difference between the drain-source voltage of the first MOS transistor 120 and the drain-source voltage of the third MOS transistor 140 becomes small, it is possible to prevent or reduce the accuracy of the current mirror circuit 10 duplicating a current from decreasing.

Furthermore, the MOS transistor described in the above description can be a bipolar transistor.

A PNP bipolar transistor can be used instead of a P-type MOS transistor, and an NPN bipolar transistor can be used instead of an N-type MOS transistor. The gate, source, and drain of the MOS transistor described in the second exemplary embodiment can be changed to the base, emitter, and collector of the bipolar transistor, respectively.

A photoelectric conversion device according to a modification example of the second exemplary embodiment in the present disclosure is described with reference to FIGS. 5A and 5B. Furthermore, constituent elements similar to those in the second exemplary embodiment are assigned the respective same reference characters as those in the second exemplary embodiment, and the description about these constituent elements may be omitted or simplified.

The modification example of the second exemplary embodiment differs from the second exemplary embodiment in the number of circuit blocks included in the circuit 1. FIGS. 5A and 5B illustrate an example of a circuit diagram of the circuit according to the present modification example.

Figure 5A:
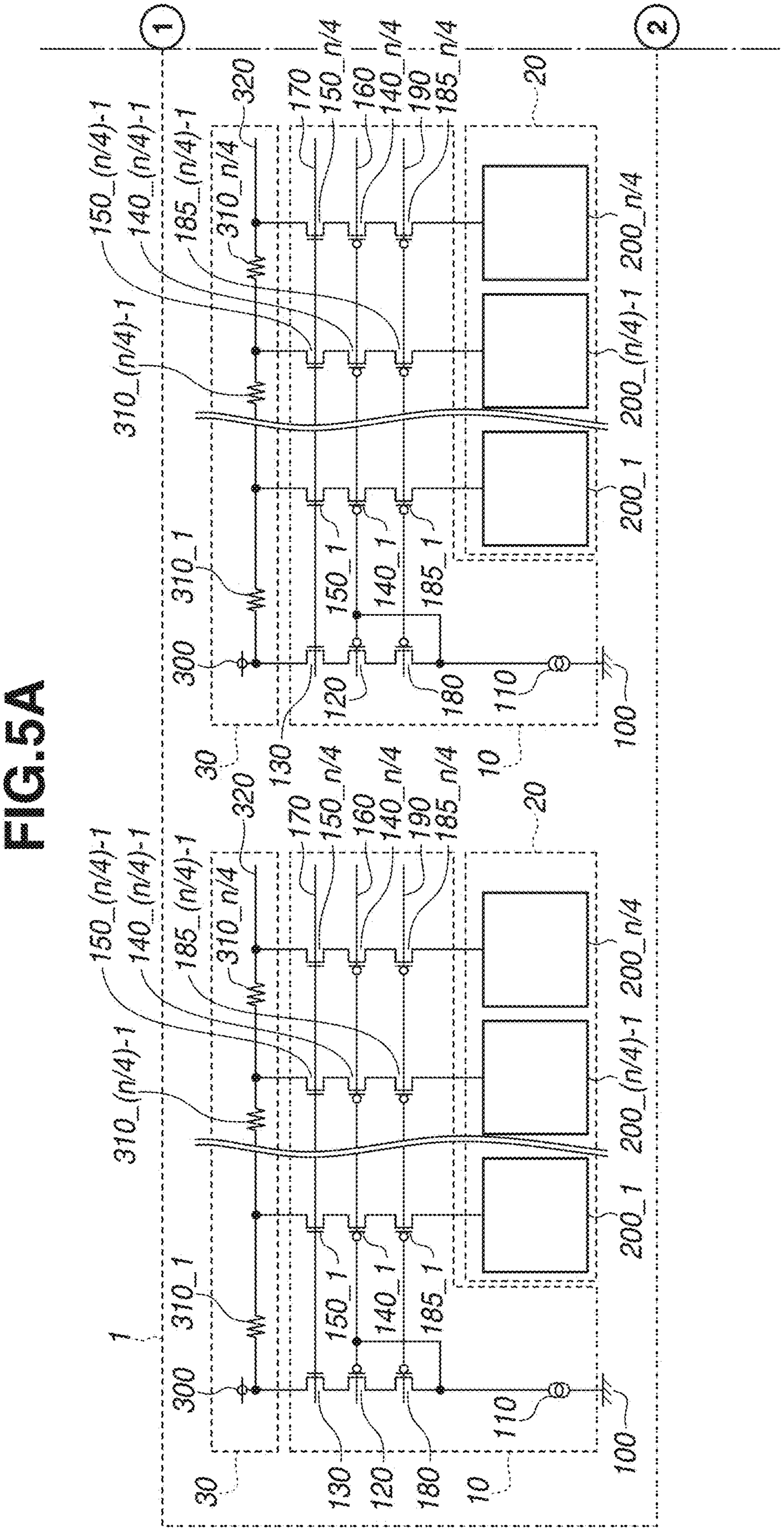
FIGS. 5A and 5B are circuit diagrams used to explain a circuit according to one or more aspects of the present disclosure in a modification example.
Figure 5B:
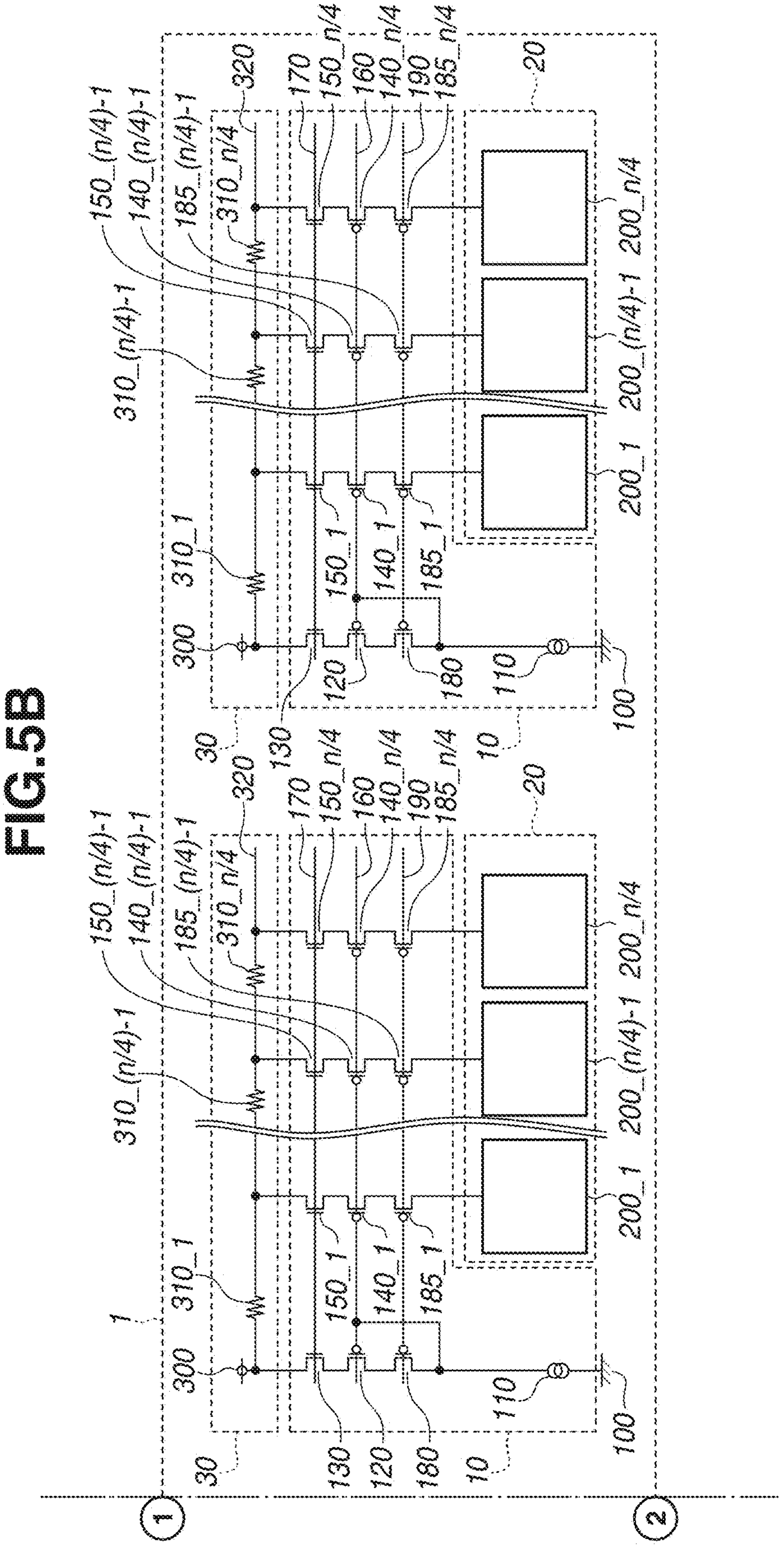

As illustrated in FIGS. 5A and 5B, the circuit 1 includes current mirror circuits 10 divided into a plurality of blocks, load circuits 20 divided into a plurality of blocks, and power source circuits 30 divided into a plurality of blocks. Here, a configuration in which a plurality of third MOS transistors 140, a plurality of fourth MOS transistors 150, a plurality of sixth MOS transistors 185, a plurality of load elements 200, and a plurality of resistance elements 310 are arranged each for n columns as illustrated in FIG. 4 is referred to as a "first circuit block". On the other hand, a configuration in which a plurality of third MOS transistors 140, a plurality of fourth MOS transistors 150, a plurality of sixth MOS transistors 185, a plurality of load elements 200, and a plurality of resistance elements 310 are arranged each for n/4 columns as illustrated in FIGS. 5A and 5B is referred to as a "second circuit block". Moreover, the second circuit block includes a first voltage node 100, a current source 110, a first MOS transistor 120, a second MOS transistor 130, a fifth MOS transistor 180, and a second voltage node 300. The circuit 1 illustrated in FIGS. 5A and 5B includes four independent second circuit blocks. Furthermore, the number of columns included in one second circuit block is not limited to n/4, but can be n/m (m being an optional natural number). Moreover, in that case, the circuit 1 includes m independent second circuit blocks.

Accordingly, in the present modification example, a difference is not likely to occur in currents which flow to the respective ones of the plurality of third MOS transistors 140, so that it is possible to prevent or reduce the accuracy of the current mirror circuit 10 duplicating a current from decreasing.

Additionally, in the present modification example, increasing the number of independent circuit blocks included in the circuit 1 enables reducing the influence of voltage drop in each circuit block, so that it is possible to prevent or reduce the accuracy of the current mirror circuit 10 duplicating a current from decreasing.

A driver integrated circuit (IC) according to a third exemplary embodiment of the present disclosure is described with reference to FIG. 6. Furthermore, constituent elements similar to those in the first exemplary embodiment and the second exemplary embodiment are assigned the respective same reference characters as those in the first exemplary embodiment and the second exemplary embodiment, and the description about these constituent elements may be omitted or simplified.

The third exemplary embodiment is applicable to each of the first exemplary embodiment and the second exemplary embodiment. FIG. 6 is an example of a schematic diagram used to explain a driver IC including a circuit described in each of the above-described exemplary embodiments.

Figure 6:
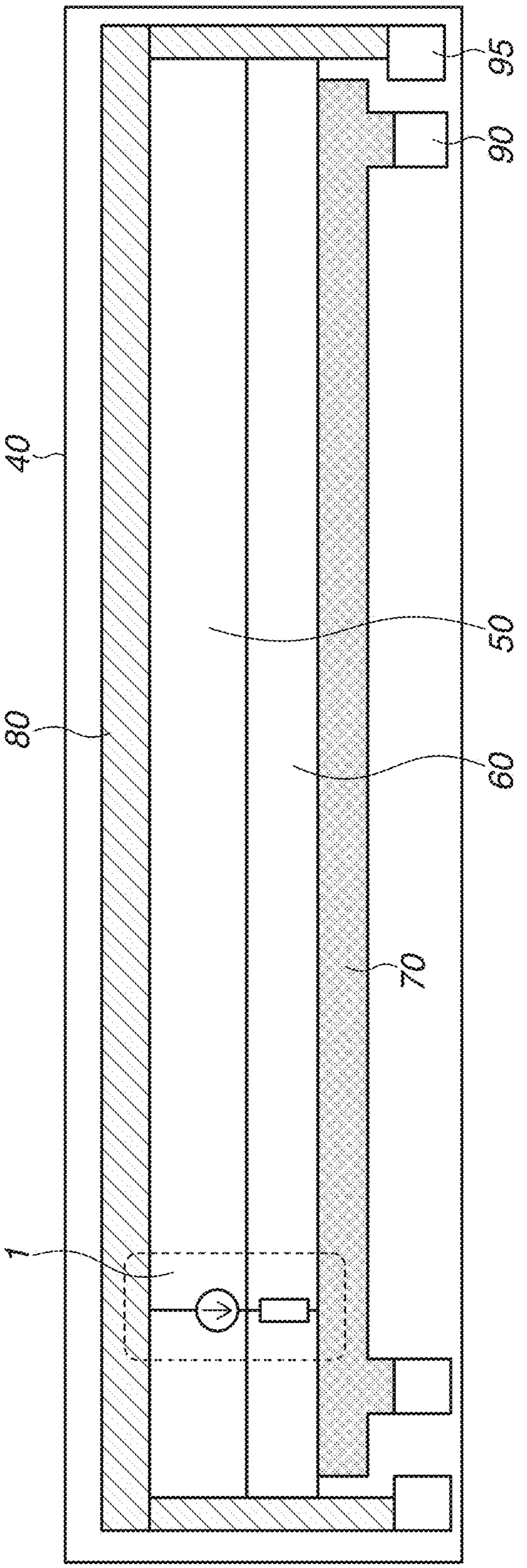
FIG. 6 is a schematic diagram used to explain a driver integrated circuit (IC) according to one or more aspects of the present disclosure.

As illustrated in FIG. 6, a driver IC 40 includes a current source array 50, a load element array 60, a first voltage wiring 70, a second voltage wiring 80, a first voltage pad 90, and a second voltage pad 95. The current source array 50 includes a plurality of current mirror circuits 10 arranged side by side in a horizontal direction. The load element array 60 includes a plurality of load circuits 20 arranged side by side in the horizontal direction. The first voltage wiring 70 includes a plurality of first voltage nodes 100 arranged side by side in the horizontal direction. The second voltage wiring 80 includes a plurality of power source circuits 30 arranged side by side in the horizontal direction. The circuit 1 includes a part of each of the current source array 50, the load element array 60, the first voltage wiring 70, and the second voltage wiring 80.

A first voltage supplied to the first voltage pad 90 is supplied to the circuit 1 via the first voltage node 100. Moreover, a second voltage supplied to the second voltage pad 95 is supplied to the circuit 1 via the second voltage node 300. Furthermore, the first voltage node 100 can be, for example, a node which supplies a reference voltage, and the second voltage node 300 can be, for example, a node which supplies a power source voltage.

While, in the third exemplary embodiment, the driver IC 40 is provided on a semiconductor chip, to reduce the cost of the semiconductor chip, it is desired to reduce the length thereof in the vertical direction. On the other hand, since, in the horizontal direction, the circuits 1 for a plurality of columns are provided, a configuration in which the length in the horizontal direction is larger than the length in the vertical direction can be employed. In such a configuration, the first voltage wiring 70 and the second voltage wiring 80 becomes high-resistance, so that the accuracy of the current mirror circuit 10 duplicating a current may decrease.

However, the driver IC 40 including the circuit 1 described in the above-described exemplary embodiments prevents or reduces the accuracy of the current mirror circuit 10 duplicating a current from decreasing.

Furthermore, the load element array 60 does not need to be included in the driver IC 40. For example, a configuration in which the load element array 60 is provided outside the semiconductor chip with the driver IC 40 provided thereon can be employed.

A light-emitting device according to a fourth exemplary embodiment of the present disclosure is described with reference to FIG. 7. Furthermore, constituent elements similar to those in the first exemplary embodiment, the second exemplary embodiment, and the third exemplary embodiment are assigned the respective same reference characters as those in the first exemplary embodiment, the second exemplary embodiment, and the third exemplary embodiment, and the description about these constituent elements may be omitted or simplified.

Figure 7:
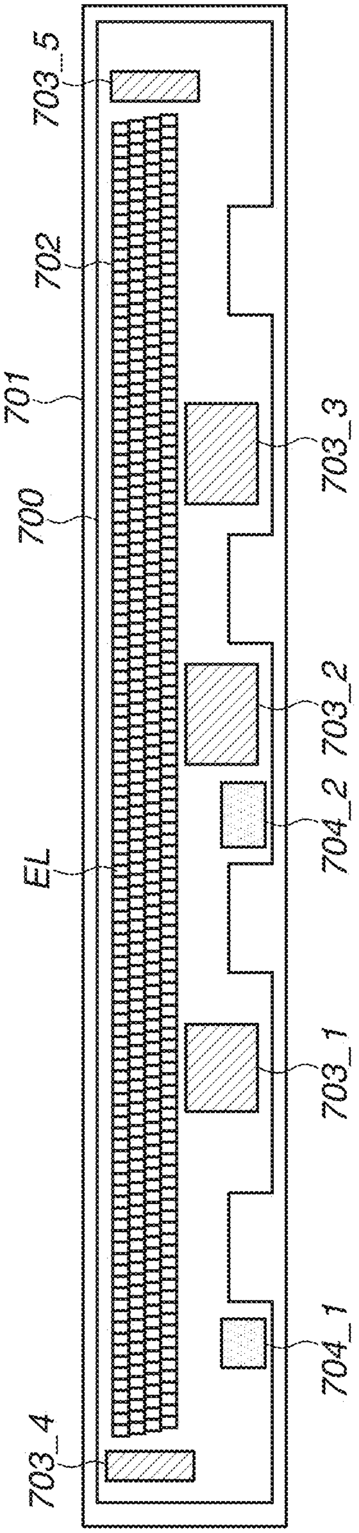
FIG. 7 is a schematic diagram used to explain a light-emitting device according to one or more aspects of the present disclosure.

FIG. 7 is an example of a schematic diagram used to explain a light-emitting device including the driver IC described in the third exemplary embodiment. The light-emitting device according to the fourth exemplary embodiment is able to be used as, for example, an exposure light source included in an image forming apparatus. The light-emitting device according to the fourth exemplary embodiment has a rectangular shape having the long side parallel to a first direction and the short side parallel to a direction intersecting with the first direction, and, for example, the first direction can be a direction along a rotation axis direction of a photosensitive member of the image forming apparatus.

As illustrated in FIG. 7, a substrate 701 has a polygonal shape, and, here, a rectangular substrate 701 is described as an example. In the present specification, the long side direction of the rectangular substrate 701 is referred to as a "first direction", and the short side direction, which intersects with the long side direction, is referred to as a "second direction". Moreover, the polygonal shape in the present specification also includes a shape with rounded edges. On the rectangular substrate 701, a moisture-resistant ring 700, which fills the role of preventing or reducing the intrusion of moisture into the inside of the light-emitting device, is arranged. The moisture-resistant ring 700 can be made as, for example, a guard ring composed of a wiring layer.

Inside the moisture-resistant ring 700, a light-emitting region 702, a contact region 703, and a circuit region 704 are arranged. In the fourth exemplary embodiment, the contact region 703 includes a first contact region 703_1, a second contact region 703_2, and a third contact region 703_3.

The circuit region 704 includes some circuits each of which drives the light-emitting device, and specific examples of the circuits include an input protection circuit, an input circuit which receives pieces of data for driving, and a logic circuit which processes data but are not limited to these. Moreover, the circuit region 704 includes the driver IC 40.

Inside the light-emitting region 702, light-emitting elements EL are arranged side by side in matrix directions. The contact region 703 is a region in which a wiring electrically connected to a common electrode for the light-emitting elements EL is arranged.

The outer circumference shape of the moisture-resistant ring 700 can include a plurality of recessed portions. These portions can be used as, for example, abutting-contact areas with which ribs serving as a part of an evaporation mask in a film formation process come into abutting contact.

Each of the light-emitting elements EL, which are arranged side by side in a matrix pattern in the light-emitting region 702, is configured with a light-emitting layer and a first electrode and a second electrode between which the light-emitting layer is interposed. In the fourth exemplary embodiment, an example in which the first electrode is an independent electrode provided for each of the light-emitting elements EL and the second electrode is a common electrode provided in common for the respective light-emitting elements EL is illustrated.

For example, in a case where four rows of light-emitting elements EL are arranged in the light-emitting region 702, as illustrated in FIG. 7, the initial position of the light-emitting elements EL in the first row and the initial position of the light-emitting elements EL in the second row can be shifted from each other by ¼ of the X-direction dimension of one light-emitting element EL in the X-direction (longitudinal direction). In a case where, when N is an integer of 2 or more, N rows of light-emitting elements EL are arranged, the initial position of the light-emitting elements EL in the first row and the initial position of the light-emitting elements EL in the second row can be shifted from each other by 1/N of the X-direction dimension of one light-emitting element EL in the X-direction. Such a configuration is advantageous for improving the resolution.

The contact region 703 is a region adjacent to the light-emitting region 702 of the rectangular substrate 701, and is arranged inside the moisture-resistant ring 700. Moreover, at least one of the contact region 703 and the circuit region 704 can be arranged, together with the recess portion of the moisture-resistant ring 700, between the light-emitting region 702 and one long-side end portion of the substrate 701 and be arranged in series relative to the long-side direction.

In this way, providing, for example, the contact region 703 and the circuit region 704 at the same position in the short-side direction enables decreasing the length in the short-side direction of the light-emitting device, thus reducing the size of the light-emitting device.

The light-emitting device according to the fourth exemplary embodiment includes a plurality of contact regions 703 between the common electrode of the light-emitting elements EL and a power source wiring along the long-side end of the light-emitting device. In a case where the common electrode is made of, for example, a transparent electrode material relatively high in electrical resistance, in the long-axis direction, the amount of voltage drop may become large. Therefore, depending on the distance from the contact region to which a potential is supplied, a difference occurs between voltages which are applied to the respective organic light-emitting diodes (OLEDs). With this, the actual light-emitting luminance may vary between OLEDs to which a voltage for causing light emission having the same luminance has been applied, so that, for example, shading may occur. Including a plurality of contact regions 703 in the long-axis direction, as in the fourth exemplary embodiment, enables preventing or reducing the voltage drop of the common electrode in the long-side direction and enables preventing or reducing the occurrence of, for example, shading.

The light-emitting device including the driver IC 40 described in the third exemplary embodiment enables preventing or reducing the accuracy of the current mirror circuit 10 duplicating a current from decreasing.

An image forming apparatus according to a fifth exemplary embodiment of the present disclosure is described with reference to FIGS. 8A, 8B, and 8C. Furthermore, constituent elements similar to those in the first exemplary embodiment, the second exemplary embodiment, the third exemplary embodiment, and the fourth exemplary embodiment are assigned the respective same reference characters as those in the first exemplary embodiment, the second exemplary embodiment, the third exemplary embodiment, and the fourth exemplary embodiment, and the description about these constituent elements may be omitted or simplified.

Figure 8A:
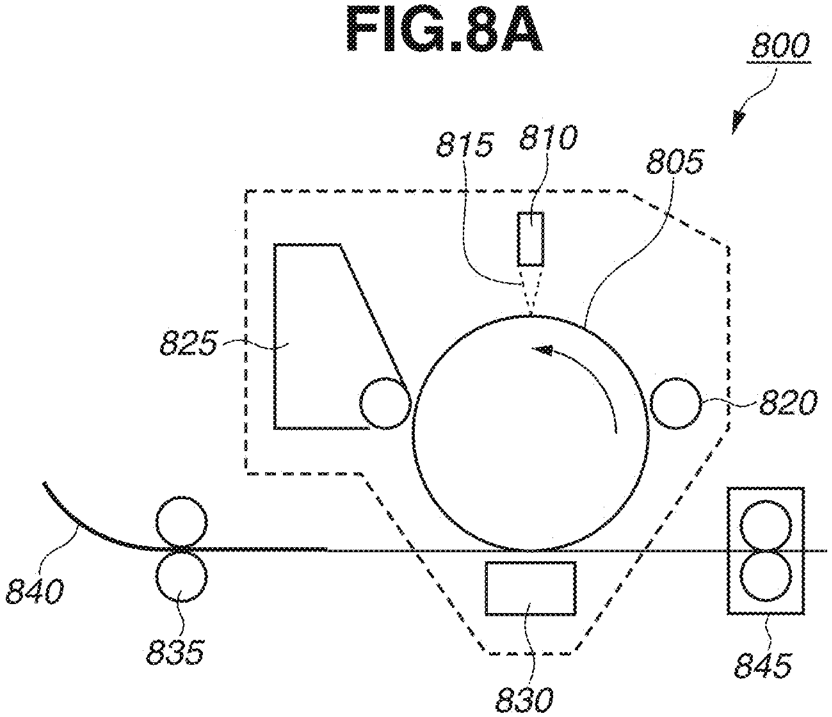
FIGS. 8A, 8B, and 8C are schematic diagrams used to explain an image forming apparatus according to one or more aspects of the present disclosure.
Figure 8B:
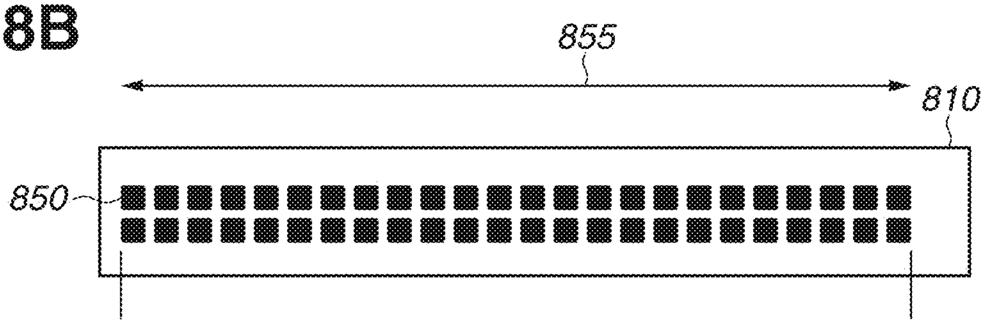
Figure 8C:
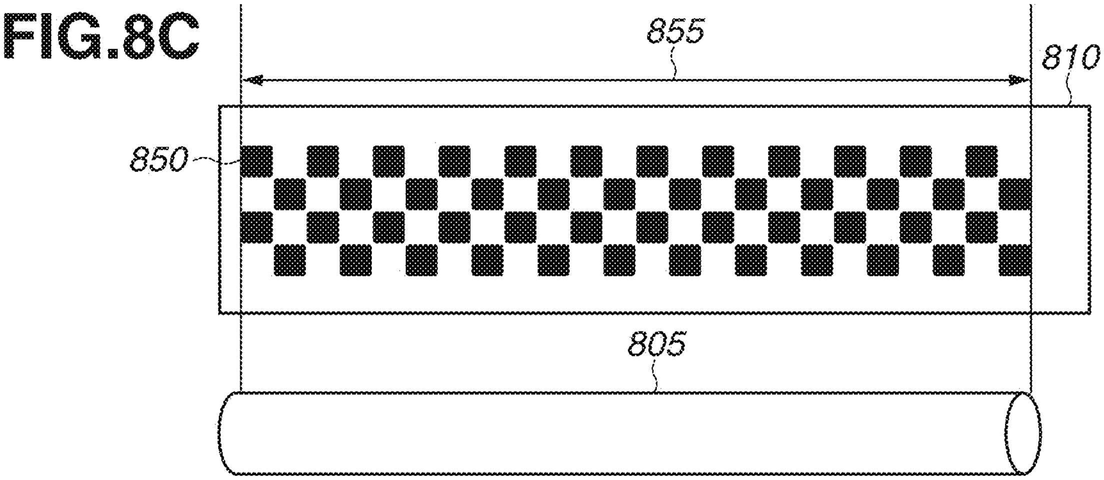

FIGS. 8A, 8B, and 8C are examples of schematic diagrams used to explain an image forming apparatus including the light-emitting device described in the fourth exemplary embodiment. An example in which the light-emitting device is used as an exposure light source in an image forming apparatus is described with reference to FIGS. 8A, 8B, and 8C.

FIG. 8A is a schematic diagram of an image forming apparatus 800 according to the fifth exemplary embodiment. The image forming apparatus 800 includes a photosensitive member 805, an exposure light source 810, a developing unit 825, a charging unit 820, a transfer device 830, a conveyance unit 835, and a fixing unit 845.

Light 815 is radiated from the exposure light source 810, which is provided opposite the photosensitive member 805, so that an electrostatic latent image is formed on the surface of the photosensitive member 805. The exposure light source 810 includes organic light-emitting elements according to an aspect of the present disclosure. The developing unit 825 contains, for example, toner. The charging unit 820 charges the photosensitive member 805. The transfer device 830 transfers a developed image to a recording medium 840. The conveyance unit 835 conveys the recording medium 840. The recording medium 840 is, for example, paper. The fixing unit 845 fixes an image formed on the recording medium 840.

FIGS. 8B and 8C are schematic diagrams each illustrating an aspect in which, in the exposure light source 810, a plurality of light-emitting portions 850 is arranged on an elongated substrate. Directions 855 are directions parallel to the axis of the photosensitive member 805, and indicate a column direction in which organic light-emitting elements are arrayed. The column direction is the same as the direction of an axis around which the photosensitive member 805 rotates. This direction can be referred to as the "long-axis direction of the photosensitive member".

FIG. 8B illustrates a configuration in which the light-emitting portions 850 are arranged along the long-axis direction of the photosensitive member 805. FIG. 8C illustrates a configuration different from that illustrated in FIG. 8B, which is a configuration in which, in each of the first column and the second column, the light-emitting portions 850 are arranged alternately one by one in the column direction. The first column and the second column are arranged at respective positions different in the row direction.

In the first column, a plurality of light-emitting portions 850 is arranged at intervals. In the second column, each light-emitting portion 850 is arranged at a position corresponding to an associated interval of the light-emitting portions 850 in the first column. Thus, even in the row direction, a plurality of light-emitting portions 850 is arranged at intervals.

The arrangement illustrated in FIG. 8C can also be rephrased as, for example, "a state in which the light-emitting portions 850 are arranged in a grid-like pattern", "a state in which the light-emitting portions 850 are arranged in a houndstooth check pattern", or "a checkerboard pattern".

The image forming apparatus 800 including the light-emitting device described in the fourth exemplary embodiment enables preventing or reducing the accuracy of the current mirror circuit 10 duplicating a current from decreasing.

An image forming apparatus according to a sixth exemplary embodiment of the present disclosure is described with reference to FIGS. 9A, 9B, and 9C. Furthermore, constituent elements similar to those in the first exemplary embodiment to the fifth exemplary embodiment are assigned the respective same reference characters as those in the first exemplary embodiment to the fifth exemplary embodiment, and the description about these constituent elements may be omitted or simplified.

Figures 9A, 9B, 9C:
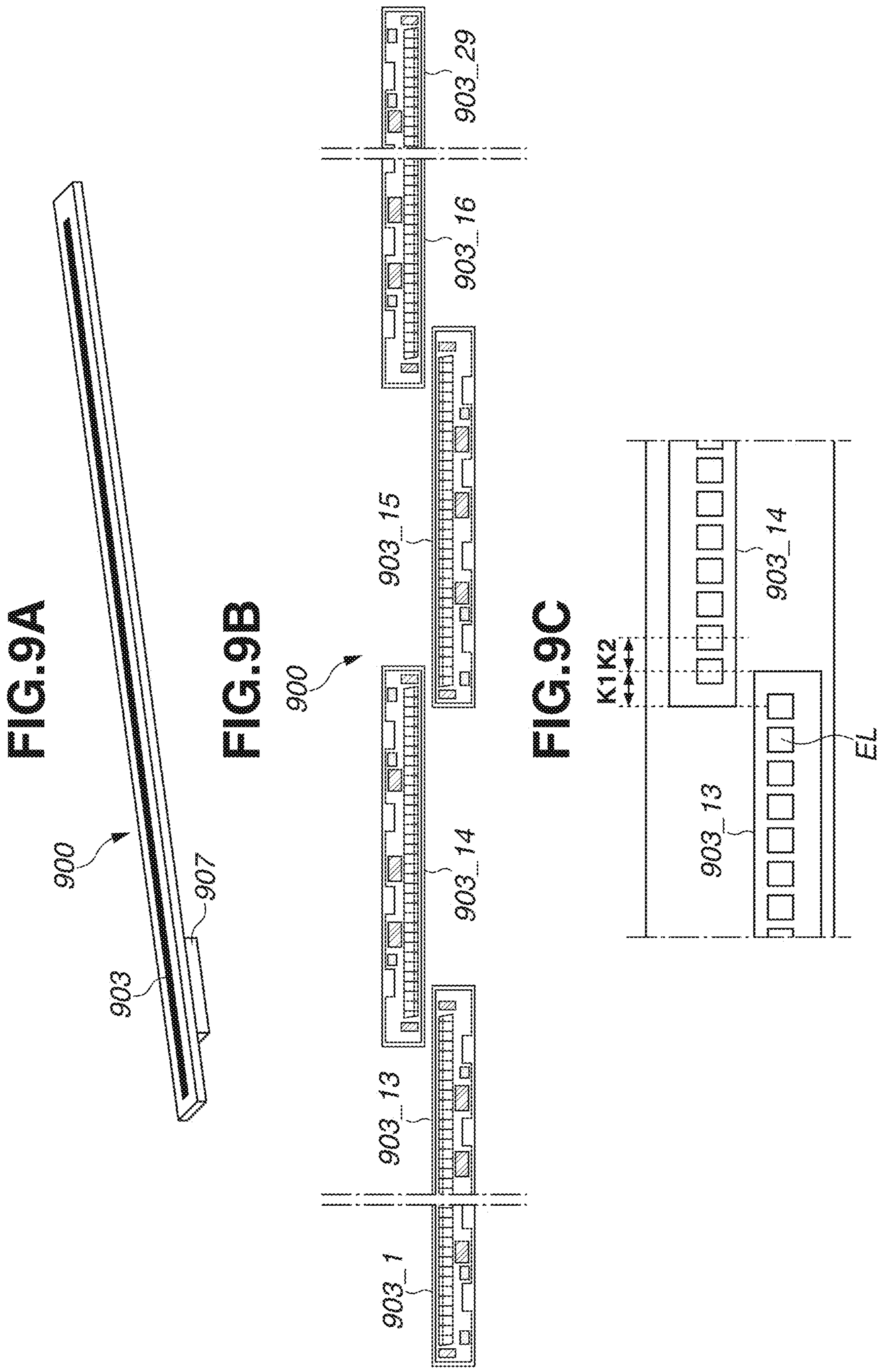
FIGS. 9A, 9B, and 9C are schematic diagrams used to explain an image forming apparatus according to one or more aspects of the present disclosure.

FIGS. 9A, 9B, and 9C are examples of schematic diagrams used to explain an image forming apparatus including the light-emitting device described in the fourth exemplary embodiment. An example in which the light-emitting device is used for a head substrate 900 of an exposure head in an image forming apparatus is described with reference to FIGS. 9A, 9B, and 9C.

FIG. 9A is an outline perspective view of the head substrate 900. FIG. 9B is a diagram illustrating the array of a plurality of light-emitting elements EL provided on the head substrate 900, and FIG. 9C is an enlarged view of a part of FIG. 9B.

Light-emitting diode (LED) chips 903 are mounted on the head substrate 900. As each of the LED chips 903, for example, the light-emitting device described in the fourth exemplary embodiment can be used.

As illustrated in FIG. 9A, the LED chips 903 are provided on one side of the head substrate 900, and an elongated flexible flat cable (FFC) connector 907 is provided on the other side of the head substrate 900. The one side of the head substrate 900 mentioned here is a surface on the side on which the LED chips 903 are provided (upper surface or front surface). The other side of the head substrate 900 mentioned here is a surface on the side opposite to the side on which the LED chips 903 are provided (lower surface or back surface).

The FFC connector 907 is mounted to the other side of the head substrate 900 (lower surface or back surface) in such a manner that the longitudinal direction of the FFC connector 907 extends along the longitudinal direction of the head substrate 900. The elongated FFC connector 907 is provided to receive, as inputs, control signals (driving signals) from a control circuit unit of the apparatus body of the image forming apparatus, and the control signals are transferred to the respective LED chips 903. Each of the LED chips 903 is driven (caused to perform light emission or caused to cease light emission) by a control signal input to the head substrate 900.

The LED chips 903 mounted to the head substrate 900 are described. As illustrated in FIGS. 9B and 9C, a plurality of light-emitting elements EL is arranged on one side of the head substrate 900. For example, LED chips 903_1 to 903_29 (29 chips) are arrayed. FIG. 9B illustrates, as an example, LED chips 903_1, 903_13, 903_14, 903_15, 903_16, and 903_29. In each of the LED chips 903_1 to 903_29, in the longitudinal direction thereof, a plurality of light-emitting elements EL is arranged, and, specifically, for example, 516 light-emitting elements EL are arrayed.

In the longitudinal direction of the LED chips 903, the center-to-center distance K2 of adjacent light-emitting elements EL corresponds to the resolution of the image forming apparatus. For example, when the resolution of the image forming apparatus in the sixth exemplary embodiment is assumed to be 1,200 dots per inch (dpi), in the longitudinal direction of the LED chips 903_1 to 903_29, the light-emitting elements EL are arrayed in such a manner that the center-to-center distance K2 of adjacent light-emitting elements EL is 21.16 micrometers (μm). Accordingly, the exposure range of the exposure head in the sixth exemplary embodiment becomes about 314 millimeters (mm).

The photosensitive layer of the photosensitive drum is formed with a width of 314 mm or more. Since the length of the long side of A4-size recording paper and the length of the short side of A3-size recording paper are 297 mm, the exposure head in the sixth exemplary embodiment has an exposure range available for image formation on A4-size recording paper and A3-size recording paper. Furthermore, while FIGS. 9A, 9B, and 9C illustrate an example in which a plurality of light-emitting elements EL is arrayed in the longitudinal direction, light-emitting elements EL can also be arrayed in the transverse direction in addition to in the longitudinal direction.

A plurality of LED chips 903_1 to 903_29 is arrayed in the axis direction of the photosensitive drum. Specifically, the LED chips 903_1 to 903_29 are arranged alternately one by one in such a way as to line up in two rows along the axis direction of the photosensitive drum. Thus, as illustrated in FIG. 9B, LED chips 903_1, 903_3, . . . , and 903_29, odd-numbered counted from the left side, are mounted in a row in the longitudinal direction of the head substrate 900. Moreover, LED chips 903_2, 903_4, . . . , and 903_28, even-numbered counted from the left side, are mounted in a row in the longitudinal direction of the head substrate 900. The LED chips 903 are arranged in this way.

With this arrangement, it is possible to, as illustrated in FIG. 9C, make the center-to-center distance K1 of light-emitting elements EL and the center-to-center distance K2 of light-emitting elements EL equal to each other in the longitudinal direction of the LED chips 903.

Here, the center-to-center distance K1 of light-emitting elements EL represents the center-to-center distance K1 of light-emitting elements EL arranged at one end of the LED chip 903_13 and at the other end of the LED chip 903_14. Moreover, the center-to-center distance K2 of light-emitting elements EL represents the center-to-center distance of adjacent light-emitting elements EL in the LED chip 903_14.

Thus, it is possible to make the center-to-center distance K1 of adjacent light-emitting elements EL arranged at one end of an LED chip 903 and at the other end of another LED chip 903 equal to the center-to-center distance K2 of adjacent light-emitting elements EL in one LED chip 903.

Furthermore, in the sixth exemplary embodiment, the light-emitting element EL is an organic light-emitting element, and is a current-driven type light-emitting element. Organic light-emitting elements are arranged on a line along the main scanning direction (axis direction of the photosensitive drum) on, for example, a thin-film transistor (TFT) substrate, and are electrically interconnected in parallel by a power source wiring also provided along the main scanning direction.

Furthermore, in a case where the light-emitting device is used for an exposure head, since the light-emitting device makes an exposure linearly, with regard to the shape of the light-emitting region 702, the ratio between the length in the longitudinal direction (first direction X) and the length in the transverse direction (second direction Y) becomes larger than in a case where the light-emitting device is used for, for example, a display device. Moreover, with regard to the shape of a substrate for the LED chips, the ratio between the length in the longitudinal direction (first direction X) and the length in the transverse direction (second direction Y) also becomes larger.

Specifically, for example, the length of the long side of the LED chip is 5 times or more the length of the short side of the LED chip, and can be 10 times or more the length of the short side of the LED chip. For example, the length of the long side of the LED chip can be set to 20 times or more the length of the short side of the LED chip.

The LED chip 903 can include a color filter. The LED chip 903 including a color filter enables, without decreasing the regular amount of light falling on the photosensitive drum, absorbing stray light coming from an unintended direction, so that it is possible to improve print quality.

The image forming apparatus including the light-emitting device described in the fourth exemplary embodiment enables preventing or reducing the accuracy of the current mirror circuit 10 duplicating a current from decreasing.

A display device according to a seventh exemplary embodiment of the present disclosure is described with reference to FIG. 10. Furthermore, constituent elements similar to those in the first exemplary embodiment to the sixth exemplary embodiment are assigned the respective same reference characters as those in the first exemplary embodiment to the sixth exemplary embodiment, and the description about these constituent elements may be omitted or simplified. The display device according to the seventh exemplary embodiment includes the driver IC described in the third exemplary embodiment.

Figure 10:
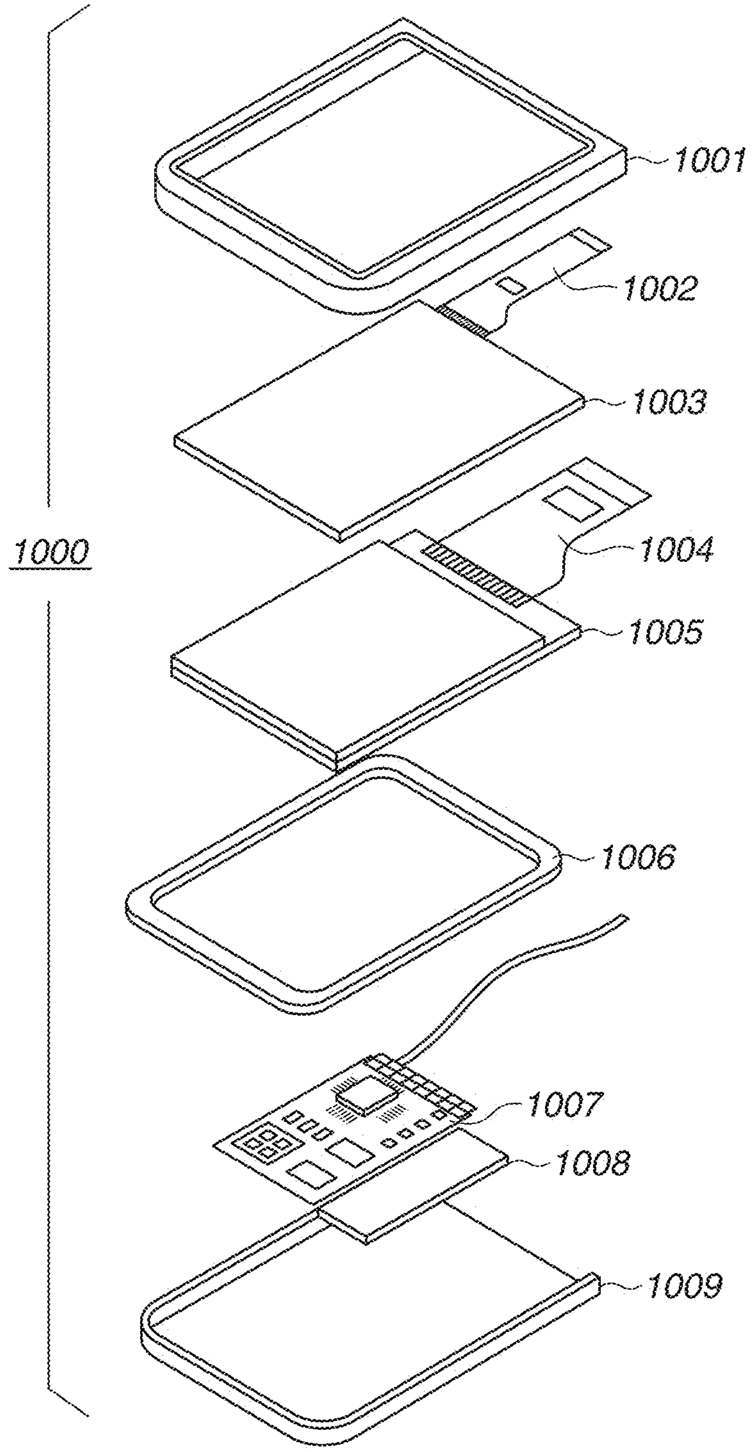
FIG. 10 is a schematic diagram used to explain a display device according to one or more aspects of the present disclosure.

FIG. 10 is a schematic diagram illustrating an example of the display device according to the seventh exemplary embodiment. The display device 1000 includes an upper cover 1001 and a lower cover 1009, and further includes a touch panel 1003, a display panel 1005, a frame 1006, a circuit board 1007, and a battery 1008 between the upper cover 1001 and the lower cover 1009. The touch panel 1003 and the display panel 1005 have flexible printed circuit (FPC) boards 1002 and 1004 connected thereto, respectively. The circuit board 1007 has transistors printed thereon. Unless the display device 1000 is a portable device, the battery 1008 does not need to be included therein, and, even if the display device 1000 is a portable device, the battery 1008 can be provided at another position.

The display device according to the seventh exemplary embodiment can include a color filter including red, green, and blue elements. In the color filter, the red, green, and blue elements can be arranged in the delta array.

The display device according to the seventh exemplary embodiment can be used for the display unit of a portable terminal. In that case, the display device can include both a display function and a manipulation function. Examples of the portable terminal include a mobile phone such as a smartphone, a tablet, and a head-mounted display.

The display device according to the seventh exemplary embodiment can be used for the display unit of an image capturing apparatus including an optical unit having a plurality of lenses and an image sensor which receives light having passed through the optical unit. The image capturing apparatus can include a display unit which displays information acquired by the image sensor. Moreover, the display unit can be a display unit exposed on the outside of the image capturing apparatus, or can be a display unit arranged inside a viewfinder. The image capturing apparatus can be a digital camera or a digital video camera.

Image capturing apparatuses according to an eighth exemplary embodiment of the present disclosure are described with reference to FIGS. 11A and 11B. Furthermore, constituent elements similar to those in the first exemplary embodiment to the seventh exemplary embodiment are assigned the respective same reference characters as those in the first exemplary embodiment to the seventh exemplary embodiment, and the description about these constituent elements may be omitted or simplified. Each of the image capturing apparatuses according to the eighth exemplary embodiment includes the driver IC described in the third exemplary embodiment.

Figure 11A:
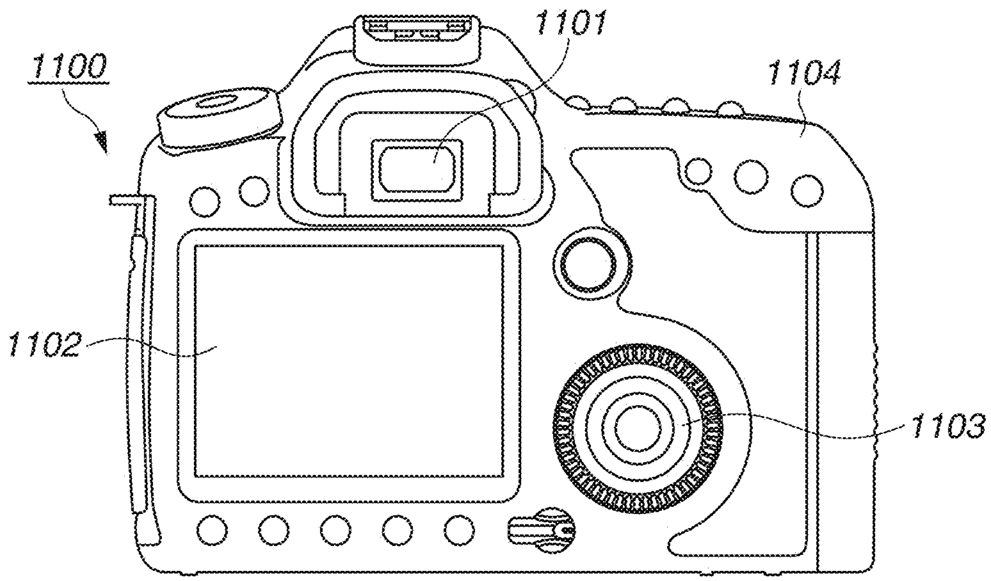
FIGS. 11A and 11B are schematic diagrams used to explain image capturing apparatuses according to one or more aspects of the present disclosure.

FIG. 11A is a schematic diagram illustrating an example of an image capturing apparatus according to the eighth exemplary embodiment. The image capturing apparatus 1100 can include a viewfinder 1101, a back-surface display 1102, an operation unit 1103, and a casing 1104. The viewfinder 1101 can include a display device described in the seventh exemplary embodiment. In that case, the display device can be configured to display not only an image to be captured but also, for example, environmental information and an image capturing instruction. The environmental information can be, for example, the intensity of external light, the orientation of external light, a speed at which a subject moves, and the possibility of a subject being shaded by a shielding object.

Since the timing suitable for image capturing is a short amount of time, it is better to display information as soon as possible. Accordingly, it is favorable to use a display device using organic light-emitting elements in an aspect of the present disclosure. This is because the organic light-emitting element is fast in response speed. The display device using organic light-emitting elements is required to have a high display speed. The display device using organic light-emitting elements can be more suitably used than a liquid crystal display device.

The image capturing apparatus 1100 includes an optical unit (not illustrated). The optical unit includes a plurality of lenses, and forms an image on an image sensor housed in the casing 1104. The plurality of lenses can be operated to perform focus adjustment by adjusting relative positions of the plurality of lenses. This operation can be performed automatically. The image capturing apparatus can be referred to as a “photoelectric conversion device”. The photoelectric conversion device can include, in addition to a method of performing sequential image capturing, for example, a method of detecting a difference from a preceding image and a method of performing clipping from images being constantly recorded, as a method of image capturing.

Figure 11B:
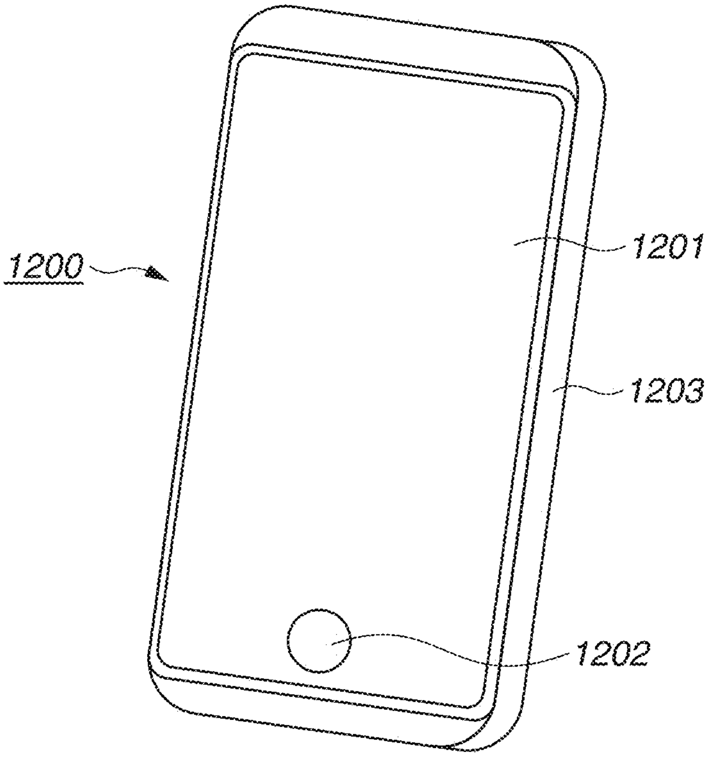

FIG. 11B is a schematic diagram illustrating an example of an electronic apparatus according to the eighth exemplary embodiment. The electronic apparatus 1200 includes a display unit 1201, an operation unit 1202, and a casing 1203. The casing 1203 can contain a circuit, a printed circuit board including the circuit, a battery, and a communication unit. The operation unit 1202 can be a button, or can be a reactive unit of the touch panel type. The operation unit 1202 can be a biological recognition unit, which performs, for example, unlocking by recognizing a fingerprint. The electronic apparatus including a communication unit can also be referred to as a “communication apparatus”. The electronic apparatus can further include a camera function by including a lens and an image sensor. An image captured by the camera function is displayed on a display unit. Examples of the electronic apparatus include a smartphone and a notebook personal computer.

Display devices according to a ninth exemplary embodiment of the present disclosure are described with reference to FIGS. 12A and 12B. Furthermore, constituent elements similar to those in the first exemplary embodiment to the eight exemplary embodiment are assigned the respective same reference characters as those in the first exemplary embodiment to the eight exemplary embodiment, and the description about these constituent elements may be omitted or simplified. Each of the display devices according to the ninth exemplary embodiment includes the driver IC described in the third exemplary embodiment.

Figure 12A:
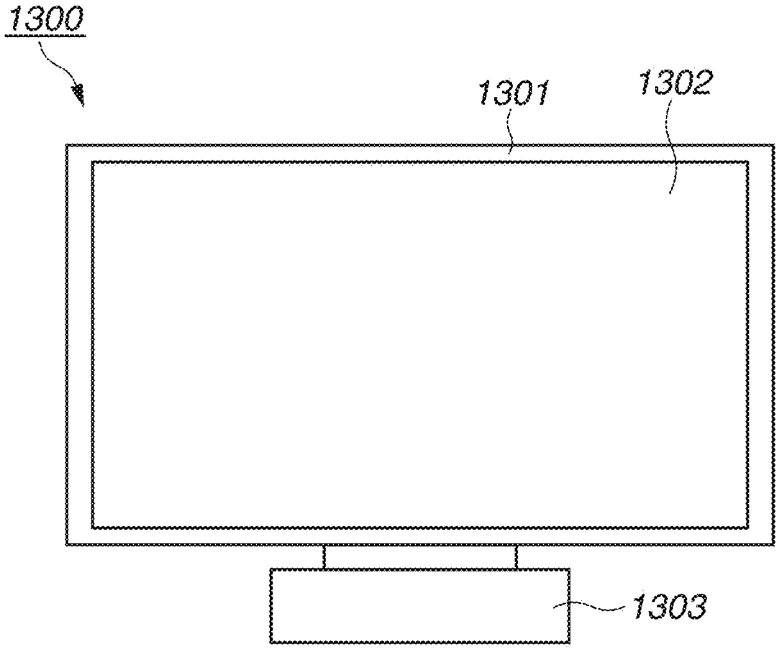
FIGS. 12A and 12B are schematic diagrams used to explain display devices according to one or more aspects of the present disclosure.
Figure 12B:
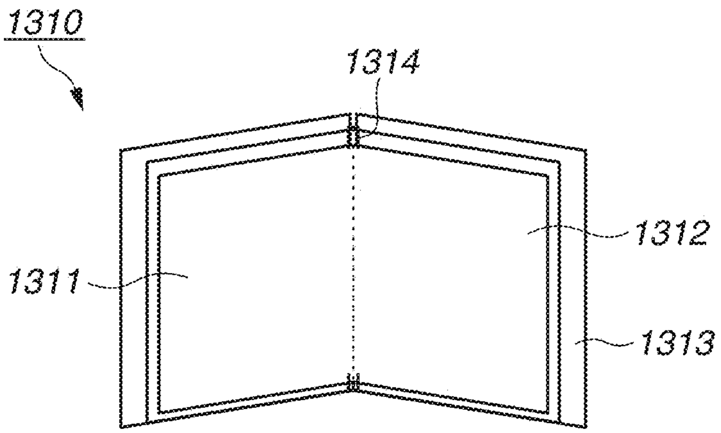

FIGS. 12A and 12B are schematic diagrams illustrating examples of the display device according to the ninth exemplary embodiment. FIG. 12A illustrates a display device such as a television (TV) monitor or a personal computer (PC) monitor. The display device 1300 includes a frame 1301 and a display unit 1302. For the display unit 1302, the light-emitting device described in the fourth exemplary embodiment can be used.

The display device 1300 further includes a pedestal 1303, which supports the frame 1301 and the display unit 1302. The pedestal 1303 is not limited to a configuration illustrated in FIG. 12A. The lower side of the frame 1301 can be also used as a pedestal.

Moreover, the frame 1301 and the display unit 1302 can be curved. The radius of curvature of them can be 5,000 mm or more and 6,000 mm or less.

FIG. 12B is a schematic diagram illustrating another example of the display device according to the ninth exemplary embodiment. The display device 1310 illustrated in FIG. 12B is configured to be foldable, and is what is called a foldable display device. The display device 1310 includes a first display unit 1311, a second display unit 1312, a casing 1313, and a folding point 1314. Each of the first display unit 1311 and the second display unit 1312 can include the light-emitting device described in the fourth exemplary embodiment. The first display unit 1311 and the second display unit 1312 can be configured to be a single display device having no joint. The first display unit 1311 and the second display unit 1312 can be divided at the folding point 1314. The first display unit 1311 and the second display unit 1312 can display respective different images, or the first display unit 1311 and the second display unit 1312 can display a single image in combination.

Illumination devices according to a tenth exemplary embodiment of the present disclosure are described with reference to FIGS. 13A and 13B. Furthermore, constituent elements similar to those in the first exemplary embodiment to the ninth exemplary embodiment are assigned the respective same reference characters as those in the first exemplary embodiment to the ninth exemplary embodiment, and the description about these constituent elements may be omitted or simplified. Each of the illumination devices according to the tenth exemplary embodiment includes the driver IC described in the third exemplary embodiment.

Figure 13A:
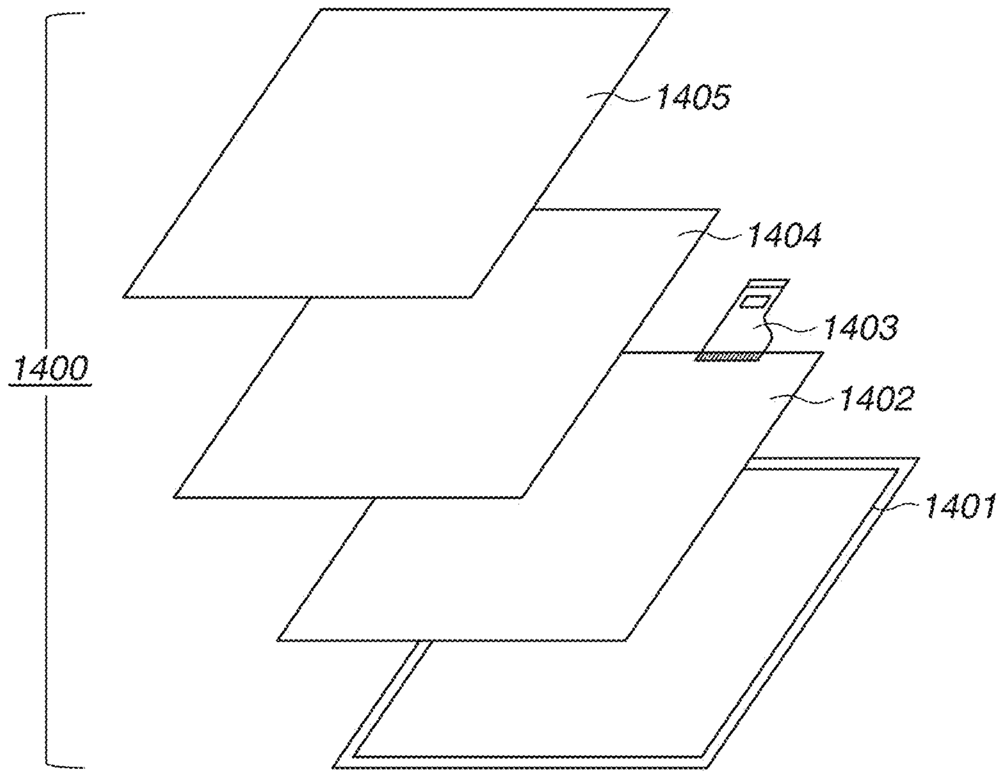
FIGS. 13A and 13B are schematic diagrams used to explain illumination devices according to one or more aspects of the present disclosure.

FIG. 13A is a schematic diagram illustrating an example of an illumination device according to the tenth exemplary embodiment. The illumination device 1400 can include a casing 1401, a light source 1402, a circuit board 1403, an optical filter 1404, and a light diffusion unit 1405. The light source 1402 can include organic light-emitting elements described in the fifth exemplary embodiment. The optical filter 1404 can be a filter which enhances color rendering properties of the light source 1402. The light diffusion unit 1405 is able to effectively diffuse light emitted from the light source 1402 to deliver light to a wide range, for example, in a lighting-up manner. The optical filter 1404 and the light diffusion unit 1405 can be provided at the light exit side of illumination. A cover can be provided at an outermost portion of the illumination device 1400 as needed.

The illumination device 1400 is, for example, a device which illuminates a room. The illumination device 1400 can be a device which emits light of any one of colors including white, daylight white, and other colors from blue to red. The illumination device 1400 can include a light control circuit which controls those colors.

The illumination device 1400 can include organic light-emitting elements according to an aspect of the present disclosure and a power source circuit which is connected to the organic light-emitting elements. The power source circuit is a circuit which converts an alternating-current voltage into a direct-current voltage. Moreover, white is 4,200 kelvin (K) in color temperature, and daylight white is 5,000 K in color temperature. The illumination device 1400 can include a color filter.

Moreover, the illumination device 1400 according to the tenth exemplary embodiment can include a heat radiator. The heat radiator is a unit which radiates heat inside the illumination device 1400 to outside the illumination device 1400, and examples of the material of the heat radiator include a high specific heat metal and liquid silicon.

Figure 13B:
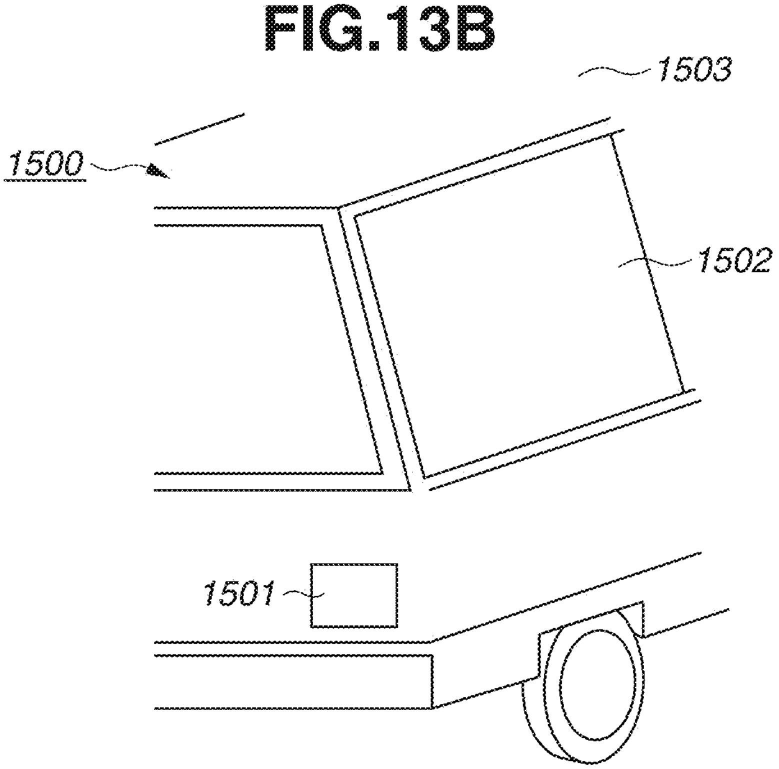

FIG. 13B is a schematic diagram of an automobile, which is an example of a moving body according to the tenth exemplary embodiment. The automobile includes a tail lamp serving as an example of a lighting appliance. The automobile 1500 includes a tail lamp 1501 and can have a configuration in which the tail lamp 1501 is turned on in response to, for example, a brake operation being performed.

The tail lamp 1501 can include organic light-emitting elements described in the fifth exemplary embodiment. The tail lamp 1501 can include a protective member which protects organic electroluminescence (EL) elements. While, as long as the protective member has a somewhat high strength and is transparent, the material thereof is not particularly limited, it is favorable that the protective member is made from, for example, polycarbonate. Polycarbonate can be mixed with, for example, furandicarboxylic acid derivatives or acrylonitrile derivatives.

The automobile 1500 can include an automobile body 1503 and a window 1502 mounted on the automobile body 1503. Unless the window 1502 is a window for checking the front and rear of the automobile 1500, the window 1502 can be a transparent display. The transparent display can include organic light-emitting elements described in the fifth exemplary embodiment. In that case, a constituent material of, for example, an electrode included in the organic light-emitting element is made from a transparent material.

The moving body according to the tenth exemplary embodiment can be, for example, a boat or ship, an airplane, or a drone. The moving body can include an airframe and a lighting appliance provided on the airframe. The lighting appliance can perform light emission for indicating the position of the airframe. The lighting appliance includes organic light-emitting elements described in the fifth exemplary embodiment.

Wearable devices according to an eleventh exemplary embodiment of the present disclosure are described with reference to FIGS. 14A and 14B. Furthermore, constituent elements similar to those in the first exemplary embodiment to the tenth exemplary embodiment are assigned the respective same reference characters as those in the first exemplary embodiment to the tenth exemplary embodiment, and the description about these constituent elements may be omitted or simplified. Each of the wearable devices according to the eleventh exemplary embodiment includes the driver IC described in the third exemplary embodiment.

Examples of the application of a display device in each of the above-described exemplary embodiments are described with reference to FIGS. 14A and 14B. The display device can be applied to a system which is wearable as a wearable device such as smart glasses, a head-mounted display (HMD), or a smart contact lens. An image capturing display device which is used for such an application example includes an image capturing device which is capable of photoelectrically converting visible light and a display device which is capable of emitting visible light.

Figure 14A:
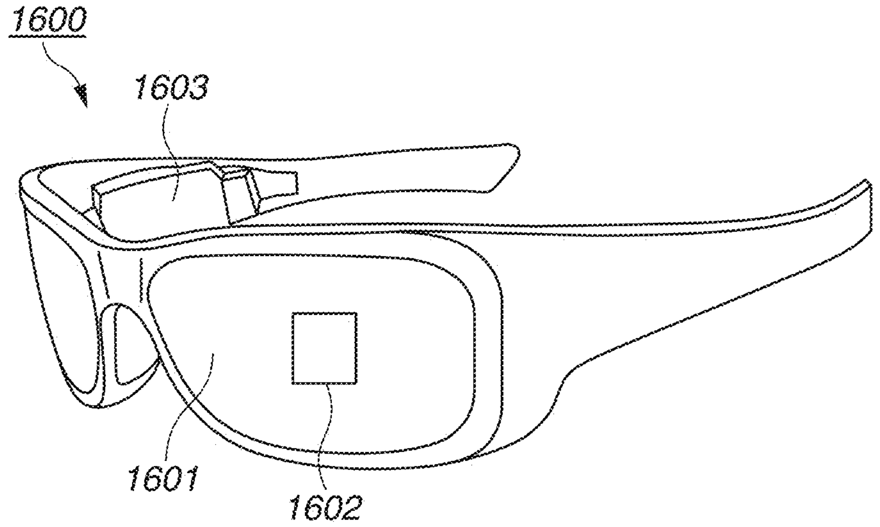
FIGS. 14A and 14B are schematic diagrams used to explain wearable devices according to one or more aspects of the present disclosure.

FIG. 14A illustrates eyeglasses 1600 (smart glasses) according to one application example. On the front surface side of a lens 1601 of the eyeglasses 1600, an image capturing device 1602 such as a complementary metal-oxide semiconductor (CMOS) sensor or a single photon avalanche diode (SPAD) sensor is provided. Moreover, on the rear surface side of the lens 1601, a display device in each of the above-described exemplary embodiments is provided.

The eyeglasses 1600 further include a control device 1603. The control device 1603 functions as a power source which supplies electric power to the image capturing device 1602 and the display device in each of the above-described exemplary embodiments. Moreover, the control device 1603 controls operations of the image capturing device 1602 and the display device. The lens 1601 includes an optical system formed therein to focus light onto the image capturing device 1602.

Figure 14B:
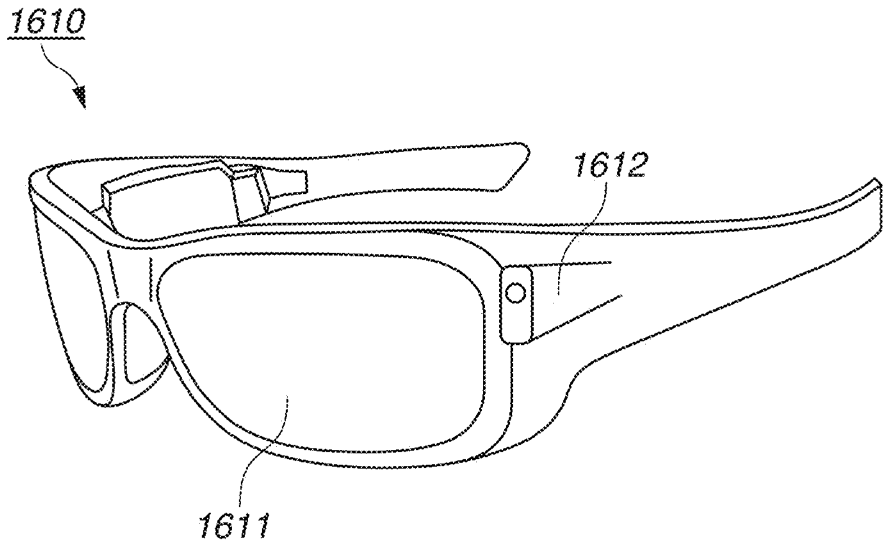

FIG. 14B illustrates eyeglasses 1610 (smart glasses) according to one application example. The eyeglasses 1610 include a control device 1612. The control device 1612 includes, mounted therein, an image capturing device, which is equivalent to the image capturing device 1602, and a display device. A lens 1611 includes an optical system formed therein to project light emitted by the display device included in the control device 1612, so that an image is projected onto the lens 1611. The control device 1612 functions as a power source which supplies electric power to the image capturing device and the display device, and controls operations of the image capturing device and the display device. The control device 1612 can include a line-of-sight detection unit, which detects the line of sight of a person wearing the eyeglasses 1610 (user). Detection of a line of sight can be performed with use of infrared (infrared light). An infrared emission unit emits infrared light to the eyeball of a user who gazes at a displayed image. Reflected light from the eyeball out of the emitted infrared light is detected by an image capturing unit including a light receiving element, so that a captured image of the eyeball is obtained. A reducing unit for reducing light traveling from the infrared emission unit to the display unit in planar view is provided, so that a decrease in the quality of an image is reduced.

A line of sight of the user on the displayed image is detected based on a captured image of the eyeball obtained by image capturing of infrared light. An optional known method can be used for line-of-sight detection using a captured image of the eyeball. For example, a line-of-sight detection method that is based on a Purkinje image formed by reflection of radiated light on the cornea can be used.

More specifically, line-of-sight detection that is based on a pupil and cornea reflection method is performed. A line-of-sight vector representing the orientation (rotational angle) of the eyeball is calculated with use of the pupil and cornea reflection method based on an image of the pupil and a Purkinje image included in the captured image of the eyeball, so that a line of sight of the user is detected.

The display device in the eleventh exemplary embodiment can include an image capturing device including a light receiving element, and a displayed image on the display device can be controlled based on line-of-sight information about the user input from the image capturing device.

Specifically, in the display device, a first display region, at which the user gazes, and a second display region, which is other than the first display region, are determined based on the line-of-sight information. The first display region and the second display region can be determined by a control device for the display device or can be the ones determined by and received from an external control device. In a display region of the display device, the display resolution of the first display region can be controlled to be higher than the display resolution of the second display region. Thus, the display resolution of the second display region can be set lower than the display resolution of the first display region.

Moreover, the display region can include a first display region and a second display region different from the first display region, and a region higher in priority can be determined out of the first display region and the second display region based on the line-of-sight information. The first display region and the second display region can be determined by a control device for the display device or can be the ones determined by and received from an external control device. The resolution of a region higher in priority can be controlled to be higher than the resolution of a region other than the region higher in priority. Thus, the resolution of a region relatively low in priority can be set low.

Furthermore, determination of the first display region or the region higher in priority can be performed with use of artificial intelligence (AI). AI can be a model configured to set an image of the eyeball and a direction at which the eyeball in the image actually looks as training data and estimate the angle of a line of sight and a distance to an object pointed by the line of sight based on the image of the eyeball. An AI program can be included in a display device, can be included in an image capturing device, or can be included in an external device. In a case where the AI program is included in the external device, the AI program is transmitted to the display device via communication.

In the case of performing display control based on line-of-sight detection, the eleventh exemplary embodiment can be favorably applied to smart glasses including an image capturing device which performs image capturing of an outside. The smart glasses are able to display captured external information in real time.

In the present specification, expressions such as “A or B”, “at least one of A and B”, “at least one of A or/and B”, and “one or more of A or/and B” include, unless particularly expressly defined, all of the combinations of recited particulars. Thus, it is understandable that the above-mentioned expressions disclose all of the cases encompassing a case of including at least one A, a case of including at least one B, and a case of including both at least one A and at least one B. This applies equally to a combination of three or more elements.

The above-described exemplary embodiments can be modified or altered as appropriate within a range which does not depart from the technical idea. Furthermore, the disclosure content of the present specification includes not only contents described in the present specification but also all of the particulars derivable from the present specification and the drawings accompanied by the present specification. Moreover, the disclosure content of the present specification includes the complement of a concept described in the present specification. Thus, if, in the present specification, for example, there is a description indicating that “A is larger than B”, even if a description indicating that “A is not larger than B” is omitted, it can be said that the present specification also discloses that “A is not larger than B”. This is because, in a case where there is a description indicating that “A is larger than B”, it is premised that a case where “A is not larger than B” is taken into consideration.

The present disclosure is directed to providing a circuit capable of preventing or reducing a decrease in the accuracy of duplicating a current.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-211543 filed Dec. 14, 2023, which is hereby incorporated by reference herein in its entirety.

What is claimed is:

1. A circuit comprising:

a current source electrically connected to a first voltage node;

a first metal-oxide semiconductor (MOS) transistor of a first type;

a second MOS transistor of a second type electrically connected to a second voltage node;

a third MOS transistor of the first type;

a first wiring connected to a gate of the first MOS transistor and a gate of the third MOS transistor;

a wiring connected to a node between the gate of the first MOS transistor and the gate of the third MOS transistor and a node between the first MOS transistor and the current source;

a fourth MOS transistor of the second type electrically connected to the second voltage node;

a second wiring connected to a gate of the second MOS transistor and a gate of the fourth MOS transistor; and a load element electrically connected to the third MOS transistor, wherein the current source, the first MOS transistor, and the second MOS transistor are arranged in sequence in an electrical path between the first voltage node and the second voltage node, wherein a current corresponding to a current which flows through the electrical path flows to the third MOS transistor, and wherein the third MOS transistor and the fourth MOS transistor are arranged in sequence in an electrical path between the load element and the second voltage node.

2. The circuit according to claim 1, wherein a current value of the current which flows through the electrical path and a current value of the current which flows to the third MOS transistor are approximately equal to each other.

3. The circuit according to claim 1, wherein the first type is a P-type, the second type is an N-type, the second MOS transistor is electrically connected to a source side of the first MOS transistor, and the current source is electrically connected to a drain side of the first MOS transistor.

4. The circuit according to claim 3, wherein the first voltage node supplies a reference voltage to the current source, and the second voltage node supplies a power source voltage to the second MOS transistor.

5. The circuit according to claim 1, wherein the first type is an N-type, the second type is a P-type, the second MOS transistor is electrically connected to a drain side of the first MOS transistor, and the current source is electrically connected to a source side of the first MOS transistor.

6. The circuit according to claim 5, wherein the first voltage node supplies a power source voltage to the current source, and the second voltage node supplies a reference voltage to the second MOS transistor.

7. The circuit according to claim 1, wherein a voltage value which is applied to the second MOS transistor and the fourth MOS transistor via the second wiring is set to a voltage value at which the second MOS transistor and the fourth MOS transistor operate in a saturation region.

8. The circuit according to claim 1, further comprising a resistance element electrically connected to the fourth MOS transistor, wherein the third MOS transistor, the fourth MOS transistor, and the resistance element are arranged in sequence in an electrical path between the load element and the second voltage node.

9. The circuit according to claim 1, further comprising a plurality of circuit blocks each including the first MOS transistor, the second MOS transistor, the third MOS transistor, and the fourth MOS transistor.

10. The circuit according to claim 1, further comprising:

a fifth MOS transistor of the first type electrically connected to the first MOS transistor;

a sixth MOS transistor of the first type electrically connected to the third MOS transistor; and a fourth wiring connected to a gate of the fifth MOS transistor and a gate of the sixth MOS transistor, wherein the current source, the fifth MOS transistor, the first MOS transistor, and the second MOS transistor are arranged in sequence in an electrical path between the first voltage node and the second voltage node, and wherein the sixth MOS transistor, the third MOS transistor, and the fourth MOS transistor are arranged in sequence in an electrical path between the load element and the second voltage node.

11. The circuit according to claim 10, further comprising a wiring connected to a node between the gate of the first MOS transistor and the gate of the third MOS transistor and a node between the fifth MOS transistor and the current source.

12. The circuit according to claim 10, wherein a voltage value which is applied to the second MOS transistor and the fourth MOS transistor via the second wiring and a voltage value which is applied to the fifth MOS transistor and the sixth MOS transistor via the fourth wiring are different from each other.

13. The circuit according to claim 10, further comprising a plurality of circuit blocks each including the first MOS transistor, the second MOS transistor, the third MOS transistor, the fourth MOS transistor, the fifth MOS transistor, and the sixth MOS transistor.

14. The circuit according to claim 1, wherein the current source, the first MOS transistor, and the third MOS transistor function as a current mirror circuit.

15. A light-emitting device comprising:

a light-emitting region; and a circuit region configured to drive the light-emitting region, wherein the circuit region includes a circuit, wherein the circuit comprises a current source electrically connected to a first voltage node, a first metal-oxide semiconductor (MOS) transistor of a first type, a second MOS transistor of a second type electrically connected to a second voltage node, a third MOS transistor of the first type, a first wiring connected to a gate of the first MOS transistor and a gate of the third MOS transistor, and a wiring connected to a node between the gate of the first MOS transistor and the gate of the third MOS transistor and a node between the first MOS transistor and the current source; and a fourth MOS transistor of the second type electrically connected to the second voltage node; and a second wiring connected to a gate of the second MOS transistor and a gate of the fourth MOS transistor; and a load element electrically connected to the third MOS transistor, wherein the current source, the first MOS transistor, and the second MOS transistor are arranged in sequence in an electrical path between the first voltage node and the second voltage node, wherein a current corresponding to a current which flows through the electrical path flows to the third MOS transistor, and wherein the third MOS transistor and the fourth MOS transistor are arranged in sequence in an electrical path between the load element and the second voltage node.

16. An image forming apparatus comprising:

a photosensitive member;

a light-emitting device arranged opposite the photosensitive member and configured to expose the photosensitive member to form a latent image on the photosensitive member; and a developing unit configured to develop the latent image formed on the photosensitive member with toner, wherein the light-emitting device comprises a light-emitting region, and a circuit region configured to drive the light-emitting region, wherein the circuit region includes a circuit, wherein the circuit comprises a current source electrically connected to a first voltage node, a first metal-oxide semiconductor (MOS) transistor of a first type, a second MOS transistor of a second type electrically connected to a second voltage node, a third MOS transistor of the first type, a first wiring connected to a gate of the first MOS transistor and a gate of the third MOS transistor, and a wiring connected to a node between the gate of the first MOS transistor and the gate of the third MOS transistor and a node between the first MOS transistor and the current source; and a fourth MOS transistor of the second type electrically connected to the second voltage node; and a second wiring connected to a gate of the second MOS transistor and a gate of the fourth MOS transistor; and a load element electrically connected to the third MOS transistor, wherein the current source, the first MOS transistor, and the second MOS transistor are arranged in sequence in an electrical path between the first voltage node and the second voltage node, wherein a current corresponding to a current which flows through the electrical path flows to the third MOS transistor, and wherein the third MOS transistor and the fourth MOS transistor are arranged in sequence in an electrical path between the load element and the second voltage node.

* * * * *